US009368231B2

(12) United States Patent
Tokunaga

(10) Patent No.: US 9,368,231 B2
(45) Date of Patent: Jun. 14, 2016

(54) SWITCHED CAPACITOR CIRCUIT AND DRIVE METHOD THEREOF

(71) Applicant: Panasonic Intellectual Property Management Co., Ltd., Osaka (JP)

(72) Inventor: Yusuke Tokunaga, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/431,501

(22) PCT Filed: Sep. 27, 2013

(86) PCT No.: PCT/JP2013/005765
§ 371 (c)(1),
(2) Date: Mar. 26, 2015

(87) PCT Pub. No.: WO2014/083736
PCT Pub. Date: Jun. 5, 2014

(65) Prior Publication Data
US 2015/0255173 A1 Sep. 10, 2015

(30) Foreign Application Priority Data

Nov. 30, 2012 (JP) ................................. 2012-263365

(51) Int. Cl.
*H03M 1/12* (2006.01)
*G11C 27/02* (2006.01)
(Continued)

(52) U.S. Cl.
CPC .............. *G11C 27/026* (2013.01); *H03F 3/005* (2013.01); *H03F 3/45475* (2013.01);
(Continued)

(58) Field of Classification Search
CPC ......... H03M 1/804; H03M 1/00; H03M 1/12; H03H 19/004; H03F 3/45475

USPC .......... 341/172, 139, 150, 155, 110; 327/307, 327/337
See application file for complete search history.

(56) References Cited

U.S. PATENT DOCUMENTS 7,692,471 B2    4/2010  Uno
7,800,427 B2 *  9/2010  Chae .................... H03H 19/004
                                                  327/337
(Continued)

FOREIGN PATENT DOCUMENTS

JP    2009-177266    8/2009
JP    2011-205540    10/2011

OTHER PUBLICATIONS

International Search Report (ISR) issued Nov. 12, 2013 in International (PCT) Application No. PCT/JP2013/005765.
(Continued)

*Primary Examiner* — Joseph Lauture
(74) *Attorney, Agent, or Firm* — Wenderoth, Lind & Ponack, L.L.P.

(57) ABSTRACT

A switched capacitor circuit according to the present invention includes: a capacitor including a first terminal to which the input voltage is applied and a second terminal; a capacitor including a third terminal and a fourth terminal; an inverting amplifier including a second output terminal and a second input terminal which is connected to the fourth terminal; a capacitor including a fifth terminal and a sixth terminal; a capacitor including a seventh terminal and an eighth terminal and included in an electrical path between the second output terminal and the fifth terminal; and a capacitor including a ninth terminal and a tenth terminal connected to the second terminal and the sixth terminal, respectively. The third terminal is connected to the second terminal. The sixth terminal is connected to the output terminal.

38 Claims, 22 Drawing Sheets

(51) Int. Cl.
  H03F 3/00 (2006.01)
  H03F 3/45 (2006.01)
  *H03M 1/00* (2006.01)
  *H03H 19/00* (2006.01)
  *H03M 1/80* (2006.01)

(52) U.S. Cl.
  CPC .. *H03M 1/1255* (2013.01); *H03F 2203/45514* (2013.01); *H03F 2203/45551* (2013.01); *H03F 2203/45634* (2013.01); *H03H 19/004* (2013.01); *H03M 1/00* (2013.01); *H03M 1/12* (2013.01); *H03M 1/804* (2013.01)

(56) References Cited

U.S. PATENT DOCUMENTS

| | | | |
|---|---|---|---|
| 7,924,206 | B2 | 4/2011 | Sano |
| 8,400,339 | B2 * | 3/2013 | Garrity .................. H03F 3/005 341/139 |
| 2008/0116966 | A1 | 5/2008 | Chae et al. |
| 2009/0185406 | A1 | 7/2009 | Uno |
| 2012/0068766 | A1 | 3/2012 | Buter et al. |
| 2012/0229204 | A1 | 9/2012 | Han et al. |

OTHER PUBLICATIONS

Y. Chae, et al., "A 2.1 M Pixels, 120 Frame/s CMOS Image Sensor With Column-Parallel ΔΣ ADC Architecture", IEEE Journal of Solid-State Circuits, vol. 46, No. 1, pp. 236-247, Jan. 2011.

B. Robert Gregoire, et al., "An Over-60 dB True Rail-to-Rail Performance Using Correlated Level Shifting and an Opamp with Only 30 dB Loop Gain", IEEE Journal of Solid-State Circuits, vol. 43, No. 12, pp. 2620-2630, Dec. 2008.

Michiel A. P. Pertijs, et al., "A CMOS Smart Temperature Sensor With a 3σ Inaccuracy of ±0.1° C. From -55° C. to 125° C.", IEEE Journal of Solid-State Circuits, vol. 40, No. 12, pp. 2805-2815, Dec. 2005.

E. Vittoz, "Microwatt Switched Capacitor Circuit Design", Electrocomponent Science and Technology, vol. 9, p. 263-273, 1982.

* cited by examiner

Sampling phase

Transfer phase

CLS phase

Sampling phase

Transfer phase

CLS phase

SWITCHED CAPACITOR CIRCUIT AND DRIVE METHOD THEREOF

TECHNICAL FIELD

The present disclosure relates to a switched capacitor circuit and a method of driving the switched capacitor circuit, and particularly to a switched capacitor circuit which performs correlated level shifting.

BACKGROUND ART

Accuracy of integrators and sample-and-hold circuits including conventional switched capacitor circuits depends on gain of inverting amplifiers included in the switched capacitor circuits. However, since high gain amplifiers generally have the drawbacks of high current consumption and low operation speed, power consumption and operation speed problems are involved in using such high gain amplifiers to increase accuracy of integrators and sample-and-hold circuits.

There has been proposed a technique to provide a high-speed inverting amplifier which includes an inverter as an amplifier in Non-Patent Literature (NPL) 1. An inverter amplifier is capable of driving at a large current during non-linear operation, and is therefore suitable as a high speed inverting amplifier. However, the gain of the inverter amplifier is 30 dB at most. An integrator or a sample-and-hold circuit including the inverter amplifier cannot achieve high accuracy alone.

In NPL 2, a technique of correlated level shifting (hereinafter referred to as CLS) has been proposed to address the problem. For example, in an integration circuit or a sample-and-hold circuit to which the technique of CLS is applied, a compensation capacitor connected in parallel with a storage capacitor is charged, and then connected in series between an amplifier output terminal and an integration capacitor, so that the output voltage of the integration circuit or the sample-and-hold circuit has a "raised level" (upward level shift). In this case, the bottom level of the voltage (shifted upward) at an output terminal of the amplifier is substantially equal to the level in a self-feedback state, so that input-referred offset due to output fluctuation is minimized. Accordingly, an integrator with a low gain amplifier using the technique of CLS operates as accurate as an integrator with a high gain amplifier.

FIG. 17 illustrates a configuration of a conventional switched capacitor circuit disclosed in NPL 2. The switched capacitor circuit disclosed in FIG. 17 functions as a two-fold amplifier using the technique of CLS. The switched capacitor circuit includes capacitors 1001, 1002, and 1004, an operational amplifier 1003, switches 1005, 1006, 1007, and 1008, a reference voltage source 1009, an input terminal 1010, and an output terminal 1011. The switched capacitor circuit in operation transits from a sampling phase to a transfer phase to a CLS phase in this order according to ON-OFF control of the switches. These phases of the switched capacitor circuit never overlap each other at any time. The following describes operation of the switched capacitor circuit in each of the phases.

FIG. 18A, FIG. 18B, and FIG. 18C are circuit diagrams illustrating connection in the switched capacitor circuit disclosed in NPL 2 in the sampling phase, transfer phase, and CLS phase, respectively.

As illustrated in FIG. 18A, in the sampling phase, the switches 1005 and 1006 are connected to the input terminal 1010, the switch 1007 is short-circuited, one of the switches 1008 connects the reference voltage source 1009 and the capacitor 1004, and the other of the switches 1008 connects the output port of the operational amplifier 1003 and the output terminal 1011. With this connection, the capacitor 1001 stores a charge of C·Vin [C] with a positive electrode on the left side of FIG. 18A, where the voltage at the input terminal 1010 is Vin [V] and the reference voltage of the reference voltage source 1009 is 0 [V]. At the same time, the capacitor 1002 stores a charge of C·Vin [C] with a positive electrode on the right side of FIG. 18A.

In the transfer phase following the sampling phase, as illustrated in FIG. 18B, the switch 1005 is connected to the reference voltage source 1009, the switch 1006 is connected to the output terminal 1011, the switch 1007 is open, and the connection of the switches 1008 are maintained. With this connection, transfer of the whole charge stored in the capacitor 1001 to the capacitor 1002 proceeds. In other words, the voltage across the capacitor 1002 increases toward 2 Vin [V]. Furthermore, the operational amplifier 1003 drives the capacitor 1004, so that the voltage across the capacitor 1004 also increases toward 2 Vin [V].

However, when the gain of the operational amplifier 1003 is insufficient, the voltage at the negative input terminal of the operational amplifier 1003 (that is, the virtual ground voltage of the system) floats. Thus, not the whole charge of the capacitor 1001 is transferred to the capacitor 1002, and the voltage at the output terminal 1011 does not reach 2 Vin [V]. Such insufficient increase of the voltage at the output terminal 1011 is caused by a large difference of voltage at the output port of the operational amplifier 1003 (approximately 2 Vin [V]) from the virtual ground voltage (equal to the voltage of the reference voltage source 1009).

In the CLS phase following the transfer phase, as illustrated in FIG. 18C, the connection of the switches 1005, 1006, and 1007 are maintained, and the one of the switches 1008 connects the output port of the operational amplifier 1003 and the capacitor 1004, and the other is open. With this connection, the capacitor 1004 is connected between the output port of the operational amplifier 1003 and the output terminal 1011. The voltage across the capacitor 1004 is approximately 2 Vin [V], which produces the "level-raising" effect (level-shifting effect) and thereby the voltage at the output port of the operational amplifier 1003 changes from approximately 2 Vin [V] to a level substantially equal to the voltage of the reference voltage source 1009 (=0 V). With this, the floating of the voltage at the negative input port of the operational amplifier 1003 (equal to the virtual ground voltage of the system) is significantly reduced, so that the charge of the capacitor 1001 is substantially completely transferred to the capacitor 1002. As a result, the voltage across the capacitor 1002 becomes substantially equal to 2 Vin, so that the switched capacitor circuit achieves accurate two-fold amplification even where the gain of the operational amplifier included in the switched capacitor circuit is low.

CITATION LIST

Non Patent Literature

[NPL 1] Y. Chae, et al., "A 2.1 M Pixels, 120 Frame/s CMOS Image Sensor With Column-Parallel ΔΣ ADC Architecture," IEEE Journal of Solid-State Circuits, vol. 46, no. 1, pp. 236-247, January 2011

[NPL 2] B. R. Gregoire, et al., "An Over-60 dB True Rail-to-Rail Performance Using Correlated Level Shifting and an Opamp With Only 30 dB Loop Gain," IEEE Journal of Solid-State Circuits, vol. 43, no. 12, pp. 2620-2630, December 2008

SUMMARY OF INVENTION

Technical Problem

However, the operational amplifier included in the switched capacitor circuit disclosed in NPL 2 is a differential operational amplifier, such that the switched capacitor circuit has difficulties in speeding up of circuit operation, lowering of power consumption, and reduction of circuit area.

An object of the present invention is to provide a switched capacitor circuit capable of faster circuit operation with lower power consumption in a smaller circuit area and operating accurately, and a method of driving the switched capacitor circuit.

Solution to Problem

Conceived to address the problem, a switched capacitor circuit according to an aspect of the present invention includes: a first input terminal to which an input voltage is input; a first output terminal from which an output voltage is output; a sampling capacitor including a first terminal to which the input voltage is applied and a second terminal; a first clamping capacitor including a third terminal and a fourth terminal, the third terminal being connected to the second terminal; a first inverting amplifier including a second input terminal and a second output terminal, the second input terminal being connected to the fourth terminal; a level-shifting capacitor including a fifth terminal and a sixth terminal, the sixth terminal being connected to the first output terminal; a second clamping capacitor including a seventh terminal and an eighth terminal and included in an electrical path between the second output terminal and the fifth terminal; and a storage capacitor including a ninth terminal and a tenth terminal, the ninth terminal being connected to the second terminal, the tenth terminal being connected to the sixth terminal.

Advantageous Effects of Invention

The switched capacitor circuit according to the present invention, which is driven using the method according to the present invention, includes not a differential operational amplifier but a single-ended inverting amplifier, and is therefore capable of operating fast with a small power and requires smaller circuit area. In addition, the switched capacitor circuit is an accurate switched capacitor circuit which performs integration operation and sample-and-hold operation, outputting a voltage which is free from application of offset voltage.

DESCRIPTION OF EMBODIMENTS

Underlying Knowledge Forming Basis of the Present Invention

The inventors of the present invention have found a problem described below.

NPL 2 discloses only an example of two-fold amplification performed by a conventional switched capacitor circuit. The following describes the problem solved by the present invention, using as an example an integration circuit generalized from the disclosed conventional technique.

Figure 1:
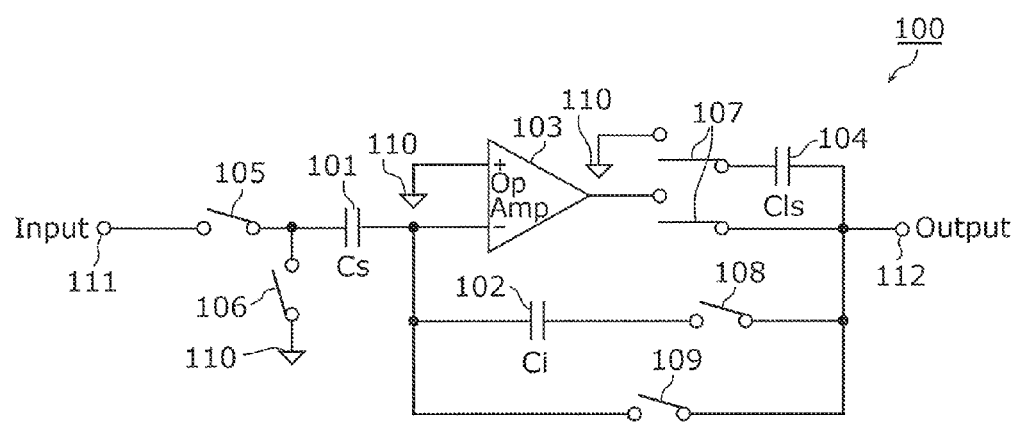
FIG. 1 illustrates an example of a circuit configuration of an integrator to which a switched capacitor including a two-fold amplifier is applied.

FIG. 1 illustrates an example of a circuit configuration of an integrator to which a switched capacitor including a two-fold amplifier is applied. As illustrated in FIG. 1, an integrator 100 includes capacitors 101, 102, and 104, an operational amplifier 103, switches 105, 106, 107, 108, and 109, a reference voltage source 110, an input terminal 111, and an output terminal 112. The integrator 100 in operation transits from a sampling phase to a transfer phase to a CLS phase in this order according to ON-OFF control of the switches. The integrator 100 operates based on operation of a switched capacitor circuit, and thus these phases never overlap each other at any time. The following describes operation of the integrator 100 in each of the phases.

Figure 2A:
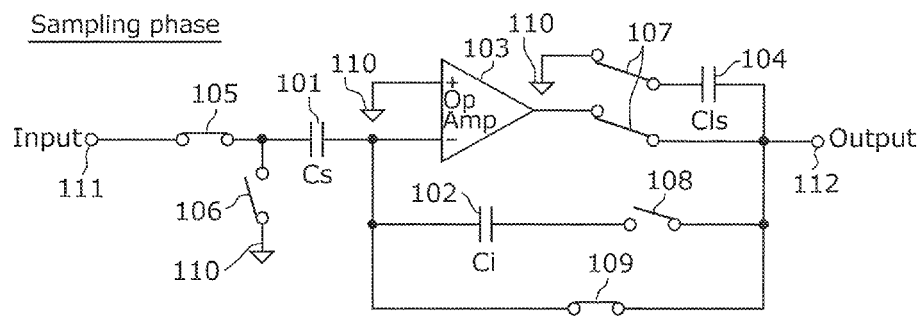
FIG. 2A is a circuit diagram illustrating connection in the integrator to which a switched capacitor including a two-fold amplifier is applied in a sampling phase.
Figure 2B:
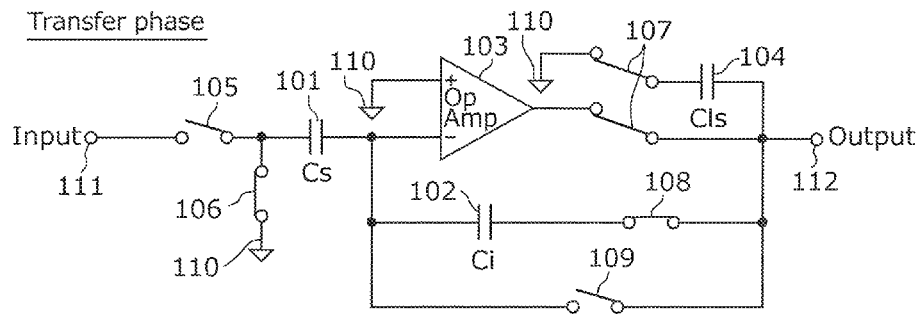
FIG. 2B is a circuit diagram illustrating connection in the integrator to which a switched capacitor including a two-fold amplifier is applied in a transfer phase.
Figure 2C:
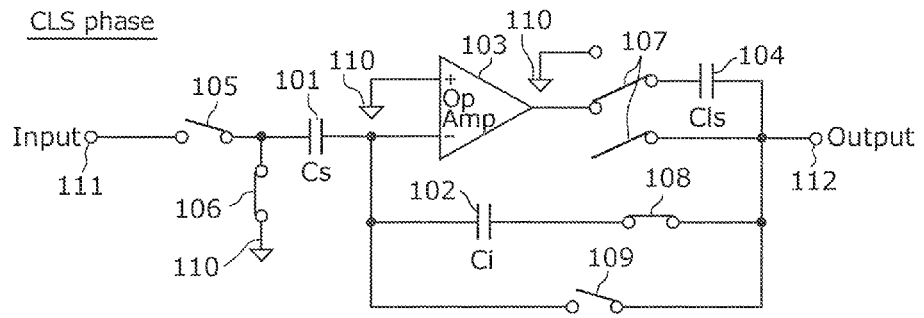
FIG. 2C is a circuit diagram illustrating connection in the integrator to which a switched capacitor including a two-fold amplifier is applied in a CLS phase.

FIG. 2A, FIG. 2B, and FIG. 2C are circuit diagrams illustrating connection in the integrator to which the switched capacitors including a two-fold amplifier is applied in the sampling phase, transfer phase, and CLS phase, respectively.

As illustrated in FIG. 2A, in the sampling phase, the switches 105 and 109 are each short-circuited, the switches 106 and 108 are open, one of the switches 107 connects the reference voltage source 110 and the capacitor 104, and the other of the switches 107 connects the output port of the operational amplifier 103 and the output terminal 112. With this connection, the capacitor 101 stores a charge of Cs·Vin [C] with a positive electrode on the left side of FIG. 2A, where the voltage at the input terminal 111 is Vin [V] and the reference voltage of the reference voltage source 110 is 0 [V]. At the same time, the capacitor 102 remains unchanged. The initial charge of the capacitor 102 is assumed to be 0 [C] for ease of explanation.

In the transfer phase following the sampling phase, as illustrated in FIG. 2B, the switches 105 and 109 are open, the switches 106 and 108 are each short-circuited, and the connection of the switches 107 is maintained. With this connection, transfer of the whole charge stored in the capacitor 101 to the capacitor 102 proceeds. In other words, the voltage across the capacitor 102 increases toward Cs·Vin/Ci [V]. Furthermore, the operational amplifier 103 drives the capacitor 104, so that the voltage across the capacitor 104 also increases toward Cs·Vin/Ci [V].

However, when the gain of the operational amplifier 103 is insufficient, the voltage at the negative input terminal of the operational amplifier 103 (that is, the virtual ground voltage of the system) floats. Thus, not the whole charge of the capacitor 101 is transferred to the capacitor 102, and the voltage at the output terminal 112 does not reach Cs·Vin/Ci [V]. Such insufficient increase of the voltage at the output terminal 112 is caused by a large difference of voltage at the output port of the operational amplifier 103 (approximately Cs·Vin/Ci [V]) from the virtual ground voltage (equal to the voltage of the reference voltage source 110).

In the CLS phase following the transfer phase, as illustrated in FIG. 2C, the connection of the switches 105 and 109 remain open, the switches 106 and 108 each remain short-circuited, and the one of the switches 107 connects the output port of the operational amplifier 103 and the capacitor 104, and the other of the switches 107 is open. With this connection, the capacitor 104 is connected between the output terminal of the operational amplifier 103 and the output terminal 112. The voltage across the capacitor 104 is approximately Cs·Vin/Ci [V], which produces the "level-raising" effect (level-shifting effect) and thereby the voltage at the output port of the operational amplifier 110 changes from approximately Cs·Vin/Ci [V] to a level substantially equal to the voltage of the reference voltage source 110 (=0 V).

With this, the floating of the voltage at the negative input port of the operational amplifier 103 (equal to the virtual ground voltage of the system) is significantly reduced, so that the charge of the capacitor 101 is substantially completely transferred to the capacitor 102. As a result, the voltage across the capacitor 102 becomes substantially equal to Cs·Vin/Ci [V], so that the integrator achieves accurate charge transfer even where the gain of the operational amplifier included in the integrator is low.

Subsequently, the operation cycle from the sampling phase through the CLS phase is repeated, so that integration operation is performed accurately despite the low gain of the operational amplifier included in the switched capacitor circuit.

However, the operational amplifier 103 used in the integrator 100 illustrated in FIG. 1 is a differential operational amplifier, and therefore operation speed, power saving, and space saving of the integrator 100 are insufficient. An integrator including a single-ended inverting amplifier surpasses the integrator 100 in terms of operation speed, power saving, and space saving.

Conceived to address the above-described problem, an object of the present invention is to provide a switched capacitor circuit capable of faster circuit operation with lower power consumption in a smaller circuit area, and operating accurately, a method of driving the switched capacitor circuit, and an integrator including the switched capacitor circuit.

The following describes embodiments of the present invention in detail with reference to the drawings. The same or equivalent components in the drawings are denoted by the same reference sign, and are described only once.

It should be noted that each of the embodiments below is described as a specific example of the present invention. The values, materials, constituent elements, layout and connection of the constituent elements, steps, and the order of the steps in the embodiments are given not for limiting the present invention but merely for illustrative purposes only. The present invention is defined by the claims. Thus, among the constituent elements in the following embodiments, a constituent element not included in the independent claim reciting the most generic concept of the present invention is not always necessary for the present invention to solve the above-described problem but shall be described as a constituent element of a preferable embodiment.

Conceived to solve the above-describe problem, a switched capacitor circuit according to an aspect of the present invention includes: a first input terminal to which an input voltage is input; a first output terminal from which an output voltage is output; a sampling capacitor including a first terminal to which the input voltage is applied and a second terminal; a first clamping capacitor including a third terminal and a fourth terminal, the third terminal being connected to the second terminal; a first inverting amplifier including a second input terminal and a second output terminal, the second input terminal being connected to the fourth terminal; a level-shifting capacitor including a fifth terminal and a sixth terminal, the sixth terminal being connected to the first output terminal; a second clamping capacitor including a seventh terminal and an eighth terminal and included in an electrical path between the second output terminal and the fifth terminal; and a storage capacitor including a ninth terminal and a tenth terminal, the ninth terminal being connected to the second terminal, the tenth terminal being connected to the sixth terminal.

In this configuration, the second clamping capacitor and the level-shifting capacitor are connected between the second output terminal of the first inverting amplifier and first output terminal according to the transition between a phase in which an input voltage is sample, a phase in which the sampled voltage is transferred, and a phase in which the level of the voltage at the second output terminal of the first inverting amplifier is shifted. The switched capacitor circuit thus provided is capable of accurate integration operation and sampling-and-holding operation to output voltage free from application of offset voltage even where the gain of the first inverting amplifier is low.

Furthermore, the second clamping capacitor samples a potential difference between a short-circuit voltage of the first inverting amplifier and a reference voltage while the first inverting amplifier is short-circuited with the second input terminal and the second output terminal connected, and the level-shifting capacitor shifts a voltage level of the second output terminal when the level-shifting capacitor is electrically connected in series between the eighth terminal of the second clamping capacitor and the first output terminal.

Furthermore, in a sampling phase: the sampling capacitor samples a potential difference between the input voltage input to the first terminal and a reference voltage; the first clamping capacitor and the second clamping capacitor each sample a potential difference between the reference voltage and a short-circuit voltage of the first inverting amplifier which is short-circuited with the second input terminal and the second output terminal connected; and the fifth terminal and the sixth terminal are short-circuited, and a path from the second terminal to the first output terminal via the storage capacitor is open.

Furthermore, in a transfer phase in which voltage sampled in the sampling phase is transferred and in a level-shifting phase in which the voltage transferred causes shifting of a voltage level of the second output terminal: the first terminal of the sampling capacitor is at the reference voltage; and the first clamping capacitor is electrically connected in series between the second terminal and the first input terminal while holding the potential difference sampled in the sampling phase, in the transfer phase: the level-shifting capacitor holds the potential difference between the reference voltage and the voltage at the second output terminal, and in the level-shifting phase, the level-shifting capacitor is electrically connected in series between the eighth terminal and the first output terminal while holding the potential difference held in the transfer phase.

In this configuration, the first and second clamping capacitors in the sampling phase each hold short-circuit voltage of the first inverting amplifier. In addition, the sampling capacitor with a first electrode which is being a positive electrode stores a charge corresponding to an input voltage. In the transfer phase following the sampling phase, transfer of the charge stored in the sampling capacitor to the storage capacitor proceeds, but the voltage at the second input terminal floats above the short-circuit voltage in the case where the gain of the inverting amplifier is low. At the same time, the voltage at the third terminal floats above the reference voltage. Thus, not the whole charge of the sampling capacitor is transferred to the storage capacitor, and the voltage at the output terminal does not reach a voltage corresponding to the capacitance ratio of the storage capacitor to the sampling capacitor. In the phase following the transfer phase, the level-shifting capacitor and the second clamping capacitor are connected in series between the second output terminal and the first output terminal. With this, the voltage at the second output terminal becomes substantially equal to the short-circuit voltage. Floating of the voltage at the second terminal, which is a virtual ground terminal of the system, is thereby significantly reduced, so that the charge of the sampling capacitor is substantially completely transferred to the storage capacitor. Consequently, the voltage across the storage capacitor becomes substantially equal to the voltage corresponding to the capacitance ratio of the storage capacitor to the sampling capacitor, so that the switched capacitor circuit achieves accurate charge transfer even where the gain of the first inverting amplifier included in the switched capacitor circuit is low. The switched capacitor circuit thus provided is an accurate switched capacitor circuit which is capable of faster operation with lower power consumption in a small circuit area, outputting a voltage free from application of offset voltage even where the gain of the first inverting amplifier is low.

Furthermore, the switched capacitor circuit further include a driver unit configured to: in a sampling phase, connect the first terminal and the first input terminal, short-circuit the second input terminal and the second output terminal, connect the sixth terminal and the eighth terminal, set the fifth terminal and the sixth terminal at a reference voltage, and open a path from the second terminal to the first output terminal via the storage capacitor; in a transfer phase in which voltage sampled in the sampling phase is transferred and in a level-shifting phase in which the voltage transferred causes shifting of a voltage level of the second output terminal, set the first terminal at the reference voltage, and electrically connect the first clamping capacitor in series between the second terminal and the first input terminal; in the transfer phase, connect the second output terminal and the sixth terminal, and connect a path from the second terminal to the first output terminal via the storage capacitor; and in the level-shifting phase, electrically connect the second clamping capacitor in series between the second output terminal and the fifth terminal, and electrically connect the level-shifting capacitor in series between the eighth terminal and the first output terminal.

With this, the switched capacitor circuit itself is capable of switching connection between the terminals for each of the phases.

Furthermore, a switched capacitor circuit includes: a first input terminal to which an input voltage is input; a first output terminal from which an output voltage is output; a sampling capacitor including a first terminal to which the input voltage is applied and a second terminal; a first inverting amplifier including a second input terminal and a second output terminal, the second input terminal being connected to the second terminal; a second inverting amplifier including a third input terminal and a third output terminal which are short-circuited, the second inverting amplifier having a short-circuit voltage equal to a short-circuit voltage of the first inverting amplifier; a level-shifting capacitor including a fifth terminal and a sixth terminal, the sixth terminal being connected to the first output terminal, and the fifth terminal switchably connected to the third output terminal or the second output terminal; and a storage capacitor including a seventh terminal and an eighth terminal, the seventh terminal being connected to the second terminal, and the eighth terminal being connected to the sixth terminal.

In this configuration, the level-shifting capacitor including a terminal set, as a reference, at a short-circuit voltage of the second inverting amplifier is connected between the second output terminal of the first inverting amplifier and the first output terminal in a phase in which the level of the voltage of the second output terminal of the first inverting amplifier. The switched capacitor circuit thus provided is capable of accurate integration operation and sampling-and-holding operation to output voltage free from application of offset voltage even where the gain of the first inverting amplifier is low.

Furthermore, the level-shifting capacitor samples a potential difference between a short-circuit voltage of the second inverting amplifier and a voltage at the second output terminal, and when the level-shifting capacitor is electrically connected in series between the second output terminal and the first output terminal, shifts a voltage level of the second output terminal.

Furthermore, the first inverting amplifier includes an inverter circuit.

With this, the inverting amplifier is an element having one input and one output, so that the circuit operates fast with a small power in a small area despite the low gain of the inverting amplifier.

Furthermore, the inverter circuit includes a switched-current bias circuit.

With this, fluctuation of current to flow into the inverting amplifier is reduced.

Furthermore, the present invention is implemented as a variety of devices including such switched capacitor circuits. For example, the present invention can be implemented as an integrator, a sample-and-hold circuit, a sensor circuit, or an analog-digital converter including the above-described switched capacitor circuit, a system LSI or an imaging device including the analog-digital converter, and a digital camera including the imaging device.

Furthermore, the present invention can be implemented not only as such a switched capacitor circuit but also as a method of driving a switched capacitor circuit. The method includes operations of the features of the switched capacitor circuit as process steps.

Embodiment 1

Figure 3:
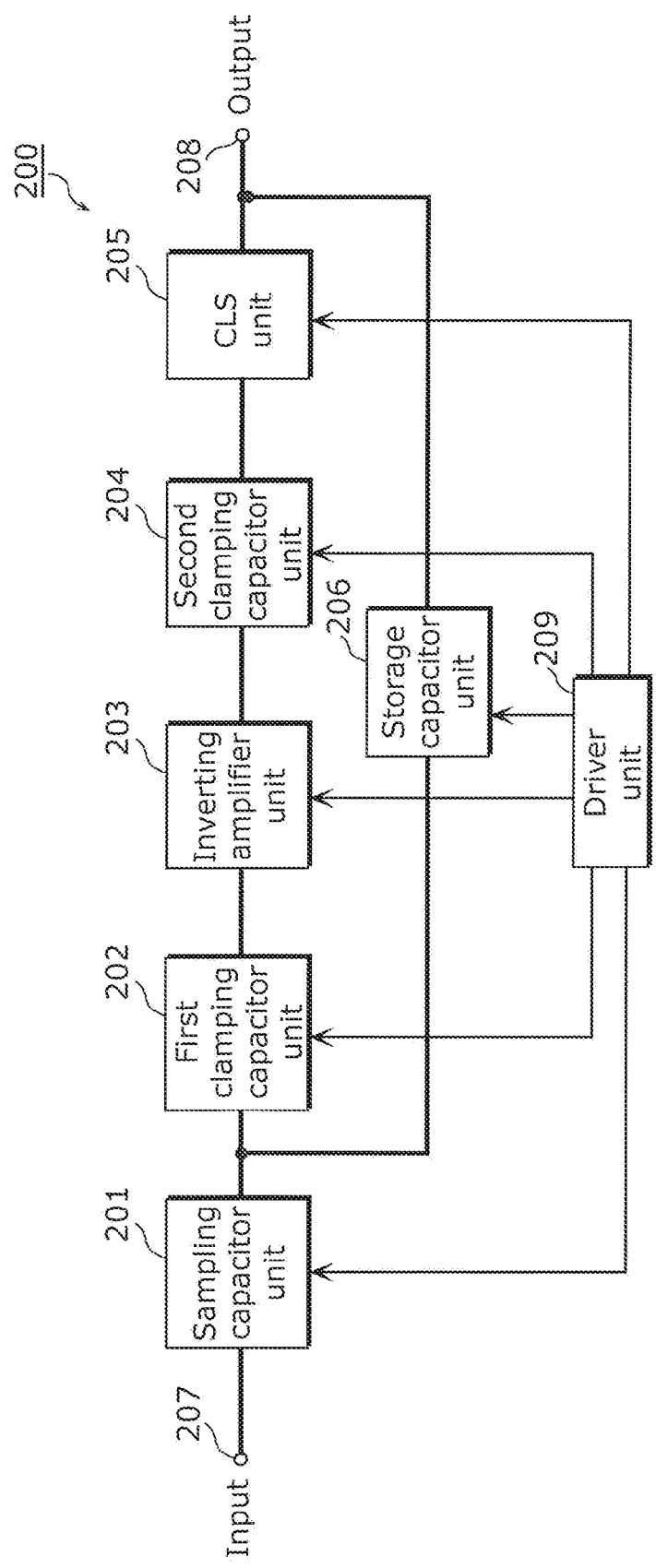
FIG. 3 is a functional block diagram of a switched capacitor circuit according to Embodiment 1.

FIG. 3 is a functional block diagram of a switched capacitor circuit according to Embodiment 1. A switched capacitor circuit 200 illustrated in FIG. 3 includes a sampling capacitor unit 201, a first clamping capacitor unit 202, an inverting amplifier unit 203, a second clamping capacitor unit 204, a CLS unit 205, a storage capacitor unit 206, an input terminal 207, an output terminal 208, and a driver unit 209. The driver unit 200 controls these units so that the switched capacitor circuit 200 in operation transits from a sampling phase to a transfer phase to a CLS phase in this order. These phases of the switched capacitor circuit 200 never overlap each other at any time.

The sampling capacitor unit 201 includes an input port and an output port. In the sampling phase, the input port is connected to the input terminal 207, and the sampling capacitor unit 201 samples a potential difference between a first reference voltage and an input voltage applied to the input terminal 207. In the transfer phase and the CLS phase, the input port of the sampling capacitor unit 201 is unconnected with the input terminal 207, so that the first reference voltage is applied to the input port.

In the sampling phase, the first clamping capacitor unit 202 samples a potential difference between the first reference voltage and an input voltage at an input port of the inverting amplifier unit 203. In the transfer phase and the CLS phase, a capacity holding the potential difference is connected in series between the output port of the sampling capacitor unit 201 and the input port of the inverting amplifier unit 203.

The inverting amplifier unit 203 includes an input port and an output port. The input port and output port of the inverting amplifier unit 203 are short-circuited in the sampling phase and open in the transfer phase and the CLS phase.

In the sampling phase, the second clamping capacitor unit 204 samples a potential difference between the first reference voltage and voltage at the output port of the inverting amplifier unit 203. In the transfer phase, the second clamping capacitor unit 204 holds the potential difference at the same time as short-circuiting of the output port of the inverting amplifier unit 203 and an input port of the CLS unit 205. In the CLS phase, a capacitor holding the potential difference is connected in series between the output port of the inverting amplifier unit 203 and the input port of the CLS unit 205.

The CLS unit 205 includes an input port and an output port. In the sampling phase and the transfer phase, the CLS unit 205 samples a potential difference between the first reference voltage and the voltage at the output port of the second clamping capacitor 204 at the same time as short-circuiting of the input port and output port of the CLS unit 205. In the CLS phase, a capacitor holding the potential difference is connected between the output port of the second clamping capacitor unit 204 and the output terminal 208.

In the sampling phase, a path from the output port of the sampling capacitor 201 to the output terminal 208 via the storage capacitor unit 206 is open. In the transfer phase and the CLS phase, the path is closed.

The driver unit 209 controls connection and disconnection between the terminals and connection and disconnection of the capacitors with the other elements in the sampling capacitor unit 201.

Figure 4:
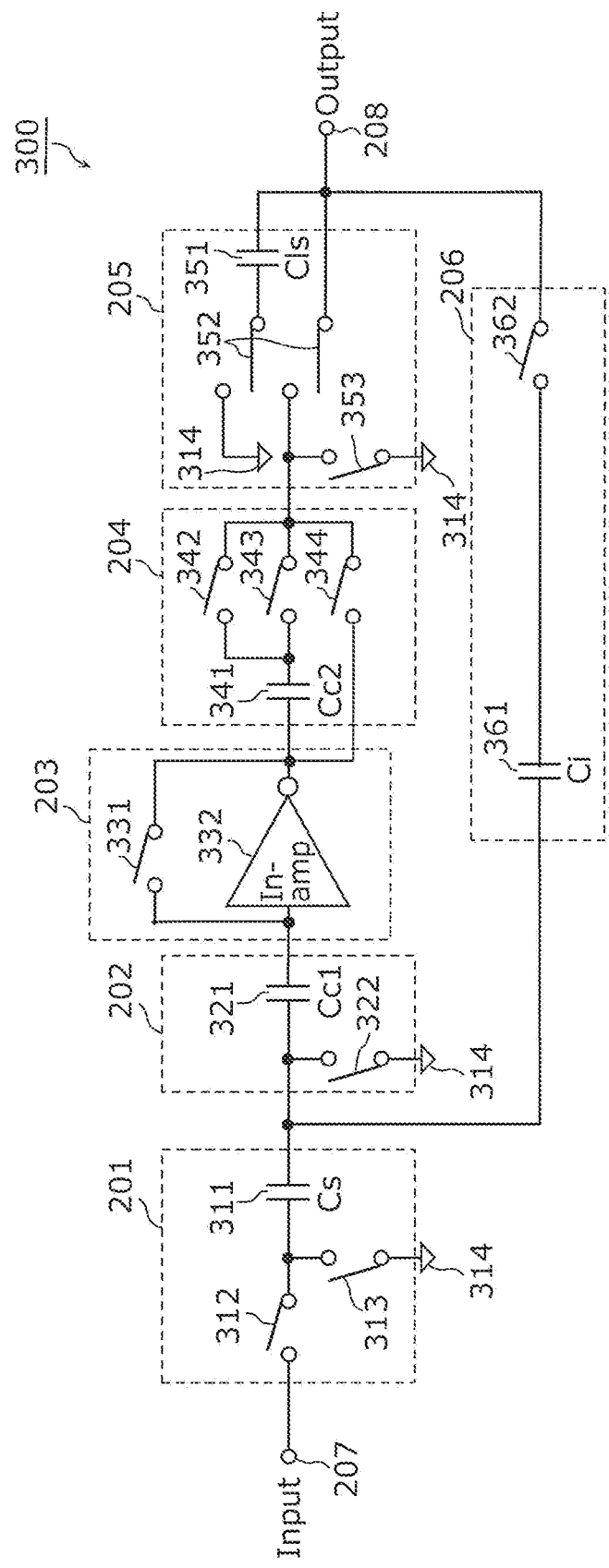
FIG. 4 is a circuit configuration diagram of the switched capacitor circuit according to Embodiment 1.

FIG. 4 is a circuit configuration diagram of the switched capacitor circuit according to Embodiment 1. The circuit configuration of the switched capacitor circuit 300 illustrated in FIG. 4 is an example of the units (except the driver unit 209) of the switched capacitor circuit 200 illustrated in FIG. 3. The input terminal 207 is a first input terminal, and the output terminal 208 is a first output terminal.

The sampling capacitor unit 201 includes a capacitor 311, a switch 312 which connects and disconnects the input terminal 207 and a first electrode of the capacitor 311, and a switch 313 which connects and disconnect the first electrode of the capacitor 311 and a reference voltage source 314. The reference voltage source 314 is set at a reference voltage, and the reference voltage in Embodiment 1 is 0 V. The capacitor 311 is a sampling capacitor including a first terminal and a second terminal, and is connected so that an input voltage is applied to the first terminal.

The first clamping capacitor unit 202 includes a capacitor 321 and a switch 322 which connects and disconnects a first electrode of the capacitor 321 and a reference voltage source 314. The capacitor 321 is a first clamping capacitor including a third terminal and a fourth terminal, and the third terminal is connected to the second terminal.

The inverting amplifier unit 203 includes a single-ended inverting amplifier 332 and a switch 331 which connects and disconnects an input port and an output port of the inverting amplifier 332. The inverting amplifier unit 332 is a first inverting amplifier including a second input terminal and a second output terminal, and the second input terminal is connected to the fourth terminal.

The second clamping capacitor unit 204 includes a capacitor 341, switches 342 and 343 which connect and disconnect a second electrode of the capacitor 341 and an input port of the CLS unit 205, a switch 344 which connects and disconnects a first electrode of the capacitor 341 and the input port of the CLS 205, and a switch 353 which connects and disconnects the input port of the CLS unit 205 and the reference voltage source 314. The capacitor 341 is a second clamping capacitor including a seventh terminal and a eighth terminal, and is included in the electrical path between the second output terminal and the fifth terminal. The capacitor 341 samples a potential difference between the short-circuit voltage of the inverting amplifier 332 and the reference voltage while the capacitor 341 is short-circuited with the second input terminal and the second output terminal connected.

The CLS unit 205 includes a capacitor 351 and switches 352. The switches 352 switchably establish a connection between a first electrode of the capacitor 351 and a reference voltage source 314 and a connection between the first electrode of the capacitor 351 and the output port of the second clamping capacitor unit 204, and connects and disconnects the output port of the second clamping capacitor unit 204 and the output terminal 208. The capacitor 351 is a level-shifting capacitor including a fifth terminal and a sixth terminal, and the sixth terminal is connected to the first output terminal. The capacitor 351 shifts the level of the voltage at the second output terminal when capacitor 351 is connected in series between the eighth terminal of the capacitor 341 and the first output terminal.

The storage capacitor unit 206 includes a capacitor 361 and a switch 362 which connects and disconnects a second electrode of the capacitor 361 and the output terminal 208. The capacitor 361 is a storage capacitor including a ninth terminal and a tenth terminal, and is connected so that the ninth terminal and the tenth terminal are connected to the second terminal and the sixth terminal, respectively.

The driver unit 209 in FIG. 3, not shown in the circuit configuration illustrated in FIG. 4, controls operation of the switches 312, 313, 322, 331, 342, 343, 344, 352, 353, and 362.

The switched capacitor circuit 300 in operation transits from a sampling phase to a transfer phase to a CLS phase in this order according to ON-OFF control of the switches. These phases of the switched capacitor circuit never overlap each other at any time. The following describes operation of the switched capacitor circuit 300 in each of the phases.

Figure 5A:
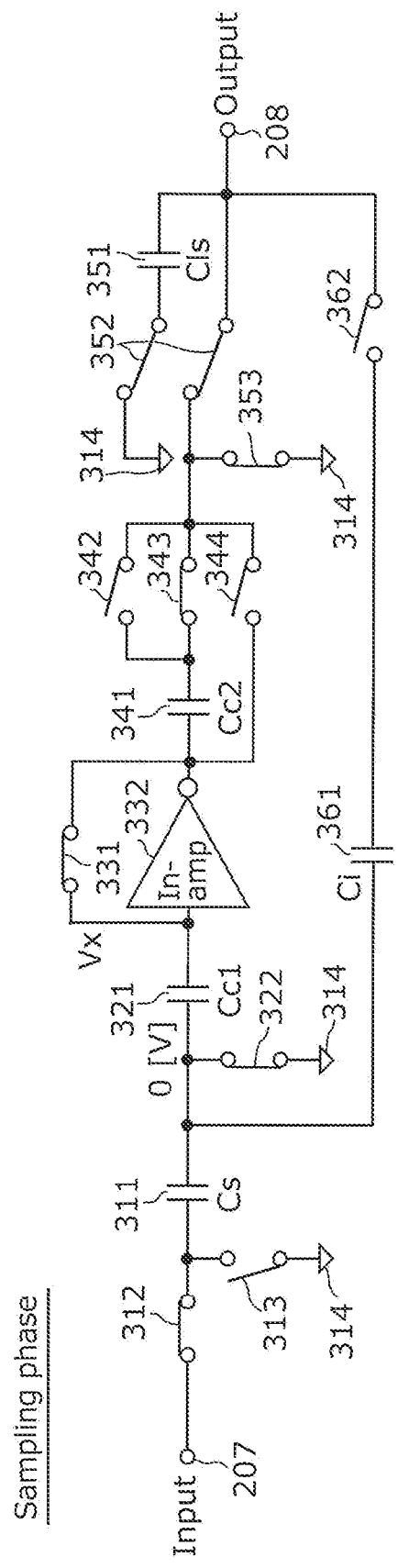
FIG. 5A is a circuit diagram illustrating connection in the switched capacitor according to Embodiment 1 in a sampling phase.
Figure 5B:
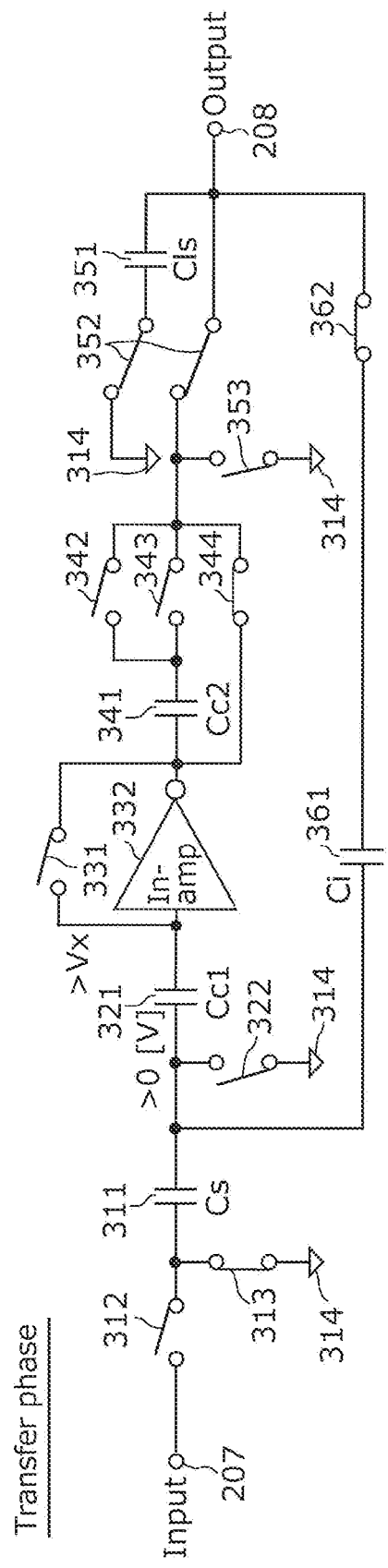
FIG. 5B is a circuit diagram illustrating connection in the switched capacitor according to Embodiment 1 in a transfer phase.
Figure 5C:
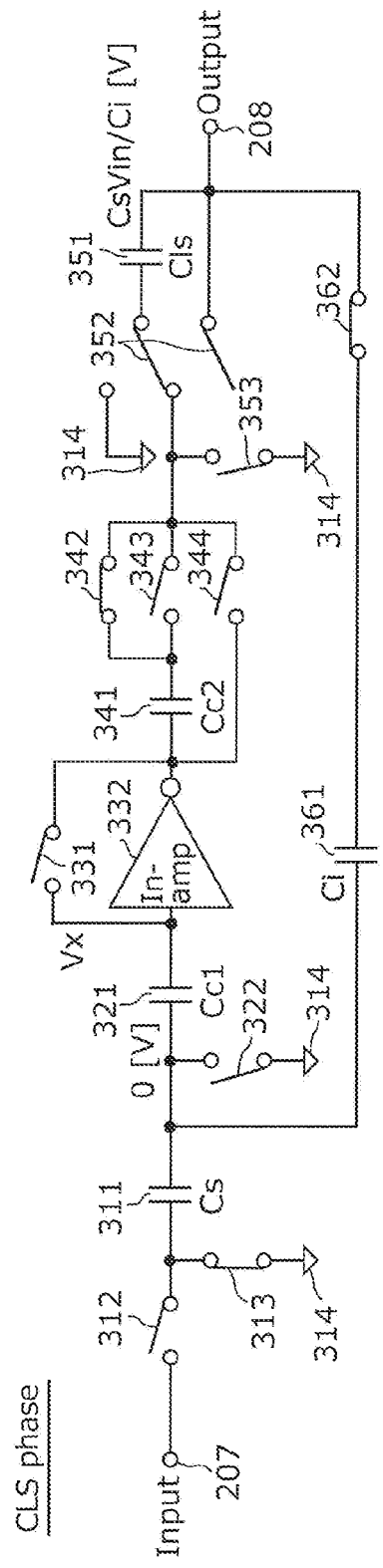
FIG. 5C is a circuit diagram illustrating connection in the switched capacitor according to Embodiment 1 in a CLS phase.

FIG. 5A, FIG. 5B, and FIG. 5C are circuit diagrams illustrating connection in the switched capacitor circuit according to Embodiment 1 in which the switched capacitor circuit is in the sampling phase, transfer phase, and CLS phase, respectively.

As illustrated in FIG. 5A, in the sampling phase in which the capacitor samples voltage, the switches 312, 322, 331, 343 and 353 are each short-circuited, the switches 313, 342, 344 and 362 are open, one of the switches 352 connects the reference voltage source 314 and a capacitor 351, and the other of the switches 352 connects the output port of the switch 343 and the output terminal 208. At this time, the input port and output port of the inverting amplifier 332 are short-circuited, and the short-circuit voltage of the inverting amplifier 332 is equal to Vx [V]. Thus, the voltage across the capacitor 321 with the fourth electrode (right side of FIG. 5A) being a positive electrode is Vx [V]. At the same time, the voltage across the capacitor 341 with the seventh electrode (left side of FIG. 5A) being a positive electrode is Vx [V]. Furthermore, the capacitor 311 stores a charge of Cs·Vin [C] with the first electrode (left side of FIG. 5A) being a positive electrode, where the voltage at the input terminal 207 is Vin [V] and the reference voltage of the reference voltage source 314 is 0 [V]. At the same time, the capacitor 361 remains unchanged. The initial charge of the capacitor 361 is assumed to be 0 [C] for ease of explanation.

In other words, in the sampling phase, the driver unit 209 connects the first terminal and the first input terminal, short-circuits the second input terminal and the second output terminal, connects the sixth terminal and the eighth terminal, sets the fifth terminal and the sixth terminal at the reference voltage, and opens the path from the second terminal up to the first output terminal via the capacitor 361. With this connection, the capacitor 311 samples a potential difference between the input voltage input to the first terminal and the reference voltage. The capacitors 321 and 341 each sample a potential difference between the reference voltage and the short-circuit voltage of the inverting amplifier 332 which is short-circuited with the second input terminal and the second output terminal connected. Furthermore, the capacitor 351 samples a potential difference between the reference voltage and the voltage at the eighth terminal.

Subsequently, in the transfer phase in which the sampled voltage is transferred, the switches 312, 322, 331, 342, 343, and 353 are open, the switches 313, 362, and 344 are each short-circuited, and the switches 352 maintain the above-described connection as illustrated in FIG. 5B. With this connection, transfer of the whole charge stored in the capacitor 311, which amount to Cs·Vin [C], to the capacitor 361 proceeds. In other words, the voltage across the capacitor 361 increases toward Cs·Vin/Ci [V]. Furthermore, the inverting amplifier 332 also drives the capacitor 351, so that the voltage across the capacitor 351 also increases toward Cs·Vin/Ci [V].

However, when the gain of the inverting amplifier 332 is insufficient, the voltage at the second input terminal of the inverting amplifier 332 (that is, the virtual ground voltage of the inverting amplifier 332) floats above Vx [V]. At the same time, the voltage at the third terminal of the capacitor 321 (that is, the virtual ground voltage of the whole system) floats above 0 [V]. Thus, not the whole charge of the capacitor 311 is transferred to the capacitor 361, and the voltage at the output terminal 208 does not reach Cs·Vin/Ci [V]. Such insufficient increase of the voltage at the output terminal 208 is caused by a large difference of the voltage at the second output terminal of the inverting amplifier 332 (approximately Cs·Vin/Ci [V]) from the virtual ground voltage Vx [V]. At this time, the current path through the capacitor 341 is open, and therefore the voltage across the capacitor 341 is maintained at Vx [V].

In other words, in the above-described transfer phase, the driver unit 209 sets the first terminal at the reference voltage, and electrically connects the capacitor 321 in series between the second terminal and the second input terminal. Furthermore, the driver unit 209 connects the second output terminal and the sixth terminal and closes the path from the second terminal to the first output terminal via the capacitor 361. With this connection, the capacitor 351 maintains a potential difference between the reference voltage and the voltage at the second output terminal.

Subsequently, in the CLS phase in which the voltage level of the second output terminal is shifted by the voltage transferred in the transfer phase, the switches 312, 322, 331, 342, 343, 344 and 353 are open, the switches 313, 362, and 342 are each short-circuited, one of the and the switches 352 connects the output port of the switch 342, and the other of the switches 352 is open as illustrated in FIG. 5C. In other words, in the CLS phase, the driver unit 209 electrically connects the capacitor 341 in series between the second output terminal and the fifth terminal and makes a connection between the fifth terminal and the eighth terminal and a connection between the sixth terminal and the first output terminal to electrically connect the capacitor 351 in series between the eighth terminal and the first output terminal. With this connection, the capacitors 351 and 341 are connected in series between the second output terminal of the inverting amplifier 332 and the output terminal 208. The voltage across the capacitor 351 remains approximately at Cs·Vin/Ci [V], and the voltage across the capacitor 341 remains at Vx [V]. This produces the "level-raising" effect (level-shifting effect) and thereby the voltage at the second output terminal of the inverting amplifier 332 changes from approximately Cs·Vin/Ci [V] to a level substantially equal to the virtual ground voltage Vx [V]. With this, floating of the the virtual ground voltage of the system is significantly reduced, so that the charge of the capacitor 311 is substantially completely transferred to the capacitor 361. As a result, the voltage across the capacitor 361 becomes substantially equal to Cs·Vin/Ci [V], so that the switched capacitor circuit 300 achieves accurate charge transfer even when the gain of the inverting amplifier included in the switched capacitor circuit 300 is low.

In the above-described configuration, the switched capacitor circuit includes not a differential operational amplifier but instead a single single-ended inverting amplifier, and thus is capable of faster operation with lower power consumption in a smaller circuit area, so that an accurate switched capacitor circuit which outputs a voltage free from application of offset voltage is provided.

The inverting amplifier 332 is an inverter circuit, for example. The inverter circuit included in the inverting amplifier 332 may include a switched-current bias circuit, for example.

Figure 6:
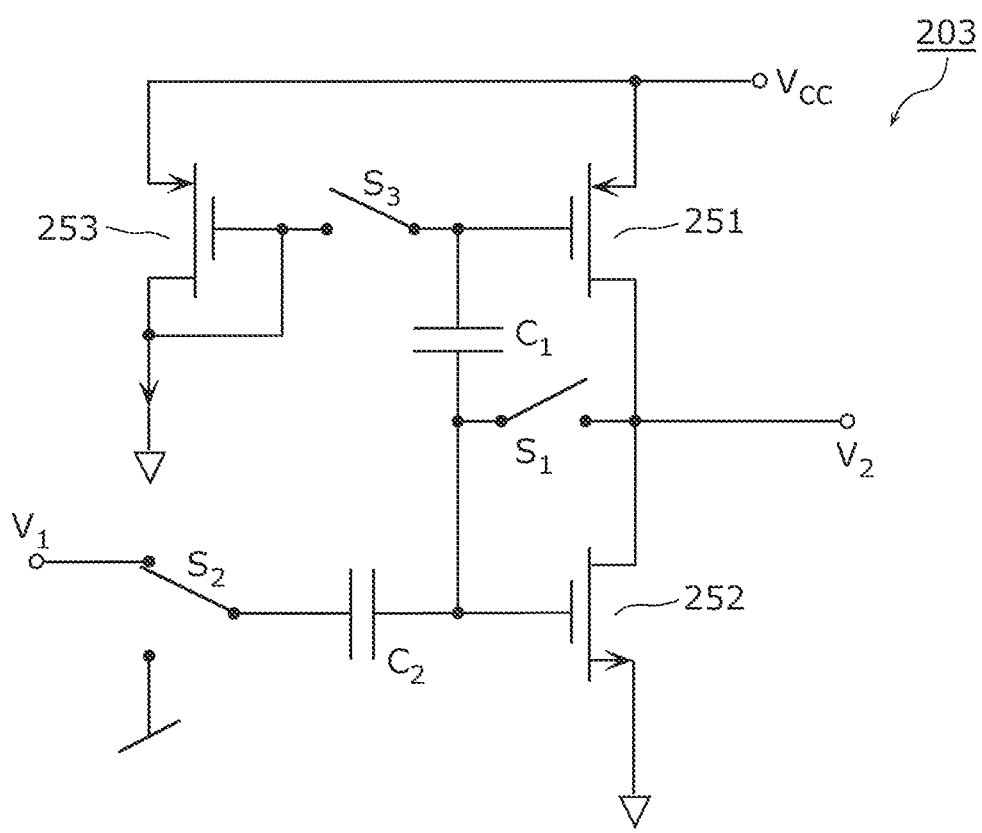
FIG. 6 is a circuit diagram illustrating an example of an inverter circuit including a switched-current bias circuit.

FIG. 6 is a circuit diagram illustrating an example of an inverter circuit including a switched-current bias circuit. In the inverting amplifier unit 203 illustrated in FIG. 6, a p-type transistor 251 and an n-type transistor 252 connected in series form a basic configuration of an inverter circuit connected between a power source terminal (voltage: Vcc) and a ground terminal terminal (voltage: 0 V). Furthermore, the inverting amplifier unit 203 includes a p-type transistor 253 which and the p-type transistor 251 forms a current mirror circuit.

When the inverter circuit in the above-described configuration is in an amplification mode in which an input voltage V1 is amplified and output as an output voltage V2 in an opposite direction to the input voltage V1, a switch S1 is open, a switch S2 is connected to an input port, and a switch S3 is open. With this connection, the circuit performs basic operation of an inverter.

When the inverter circuit is in short-circuit mode in which the input port and the output port are short-circuited, the switch S1 is short-circuited, the switch S2 is connected to the ground terminal, and the switch S3 is short-circuited. With this connection, a current flowing through the p-type transistor 251 and the n-type transistor 252 keeps the same as the current of a reference current Ib flowing through the p-type transistor 253. In the short-circuit mode, the current flowing through the p-type transistor 251 and the n-type transistor 252 is maintained constant by the reference current Ib, so that the inverter circuit has stable properties, particularly stable consumption current, free from fluctuation in process, temperature, and power supply voltage. Thus, including a single-ended inverter circuit, the switched capacitor circuit is an accurate switched capacitor circuit which operates fast with a small power in a smaller circuit area, outputting a voltage free from application of an offset voltage.

Furthermore, the switched capacitor circuit performs iterations of the operation cycle from the sampling phase through the CLS phase, and thereby performs integration operation accurately despite the low gain of the operational amplifier included in the switched capacitor circuit.

Figure 7A:
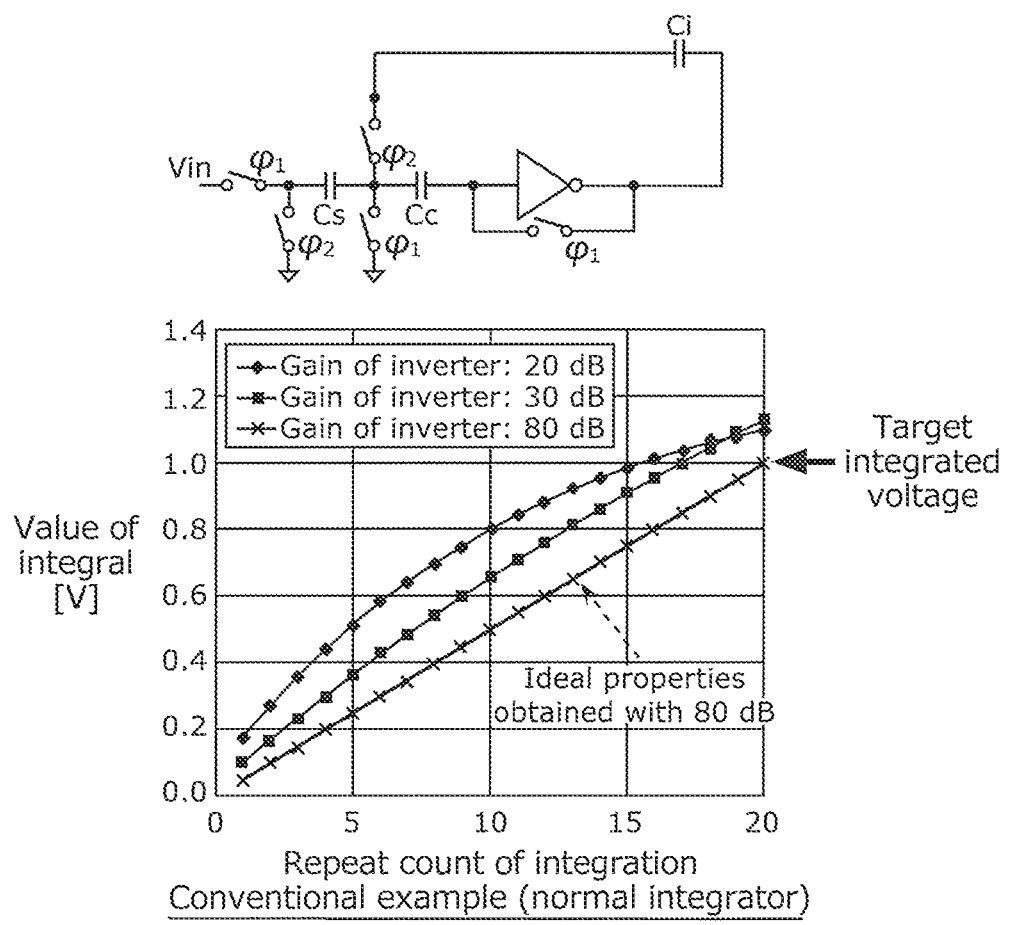
FIG. 7A is a chart showing integration characteristics of a conventional integrator disclosed in NPL 1.
Figure 7B:
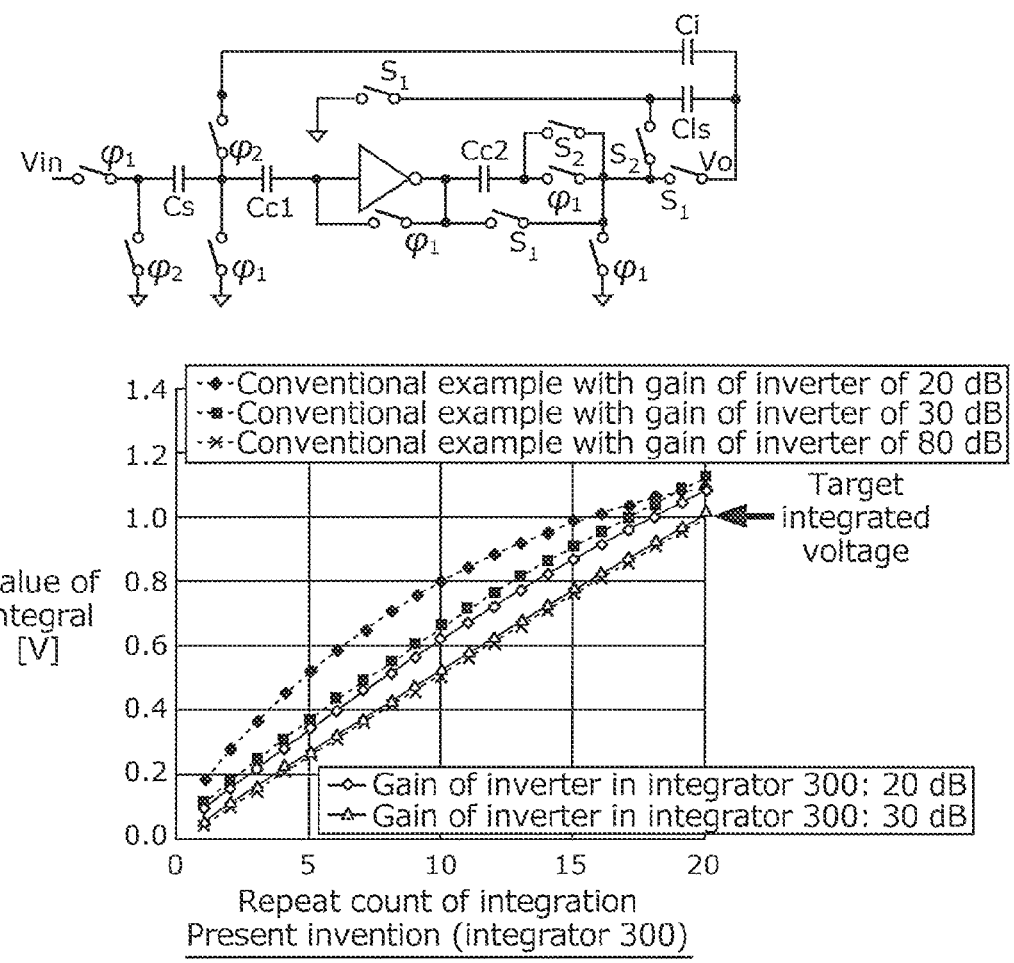
FIG. 7B is a chart comparing integration characteristics of the switched capacitor circuit according to Embodiment 1 with the integration characteristics of the conventional integrator disclosed in NPL 1.

FIG. 7A is a chart showing integration characteristics of a conventional integrator disclosed in NPL 1. FIG. 7B is a chart comparing integration characteristics of the switched capacitor circuit according to Embodiment 1 with the integration characteristics of the conventional integrator disclosed in NPL 1. The charts in FIG. 7A and FIG. 7B depict simulation results of a transient property where input voltage Vin is 50 mV and capacitance Cs, Cc1, Cc2, Cls, and Ci of the respective capacitors 311, 321, 341, 351, and 361 are all 100 fF. In each of the charts, the horizontal axis indicates the repeat count of integration, and the vertical axis indicates the value of integral (output voltage V). When integration is repeated 20 times, the resultant value of integral ideally amounts to 1 V (20×50 mV).

FIG. 7A shows that a conventional integrator including an inverting amplifier having a gain of 80 dB obtains such a highly accurate value of integral by each integration operation that the relationship between the repeat count of integration and the value of integral is substantially linear. Compared to this, in the case of an inverting amplifier having a gain of 30 dB and the case of an inverting amplifier having a gain of 20 dB, such a linear relationship between the repeat count of integration and the value of integral is not present, so that the value of integral obtained as a result of 20 times of integration operation deviates from the target integrated voltage 1 V).

In contrast, FIG. 7B shows that the switched capacitor circuit 300 according to Embodiment 1 including an inverting amplifier having a gain of 30 dB yields such a highly accurate value of integral by each integration operation that the relationship between the repeat count of integration and the value of integral is substantially linear. Furthermore, the switched capacitor circuit 300 including an inverting amplifier having a gain of 20 dB exhibits significantly improved properties compared to the conventional integrators including inverting amplifier having lower gains.

Figure 7C:
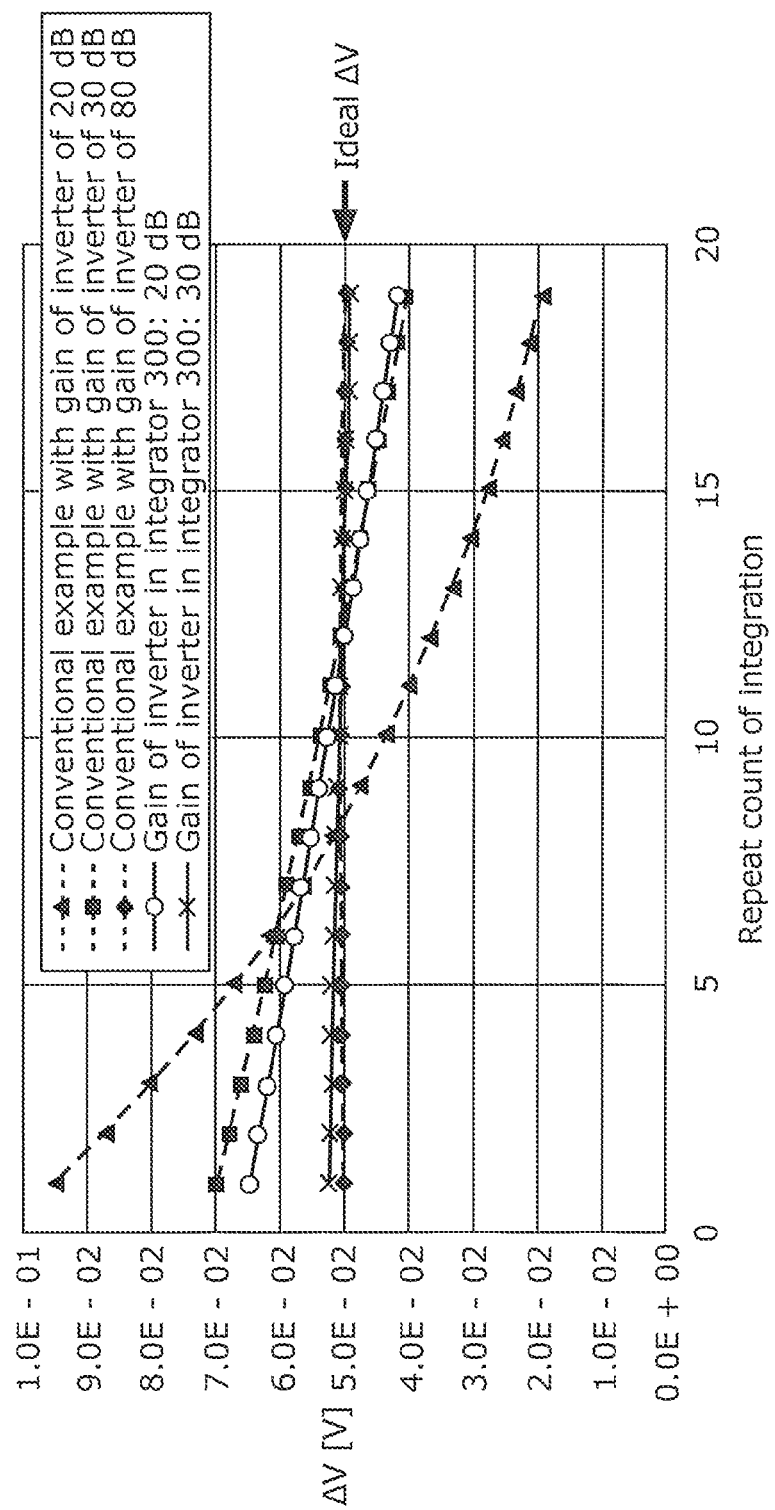
FIG. 7C is a chart showing a relationship between the repeat count of integration and change in output voltage for each integration operation.

FIG. 7C is a chart showing a relationship between the repeat count of integration and change in output voltage for each integration operation. In FIG. 7C, the vertical axis indicates increase in output voltage LW [V] by each integration operation. FIG. 7C shows that LW is a substantially constant value of 50 mV for each integration operation in the case of the switched capacitor circuit 300 according to Embodiment 1 which includes an inverting amplifier having a gain of 30 dB as well as in the case of the conventional integrator including an inverting amplifier having a gain of 80 dB.

The above-described comparison shows that an integrator including one single-ended inverting amplifier and first and second clamping capacitor units is an accurate integrator which outputs a voltage free from application of offset voltage.

The control operation in Embodiment 1 is not limited to the control method using the driver unit 209 which synchronously sends control signals to the other units of the switched capacitor circuit 200 illustrated in FIG. 3 so that the switched capacitor circuit 200 transits from the sampling phase to the transfer phase to the CLS phase. For example, each of the switches included in the units may asynchronously and autonomously switches upon or in conjunction with switching between ON and OFF of the other switches.

Embodiment 2

In Embodiment 2, a switched capacitor circuit further includes a short-circuited single-ended inverting amplifier instead of the first and second clamping capacitor units of the switched capacitor circuit according to Embodiment 1, and thereby operates as an accurate switched capacitor circuit which outputs voltage free from application of offset voltage.

Figure 8:
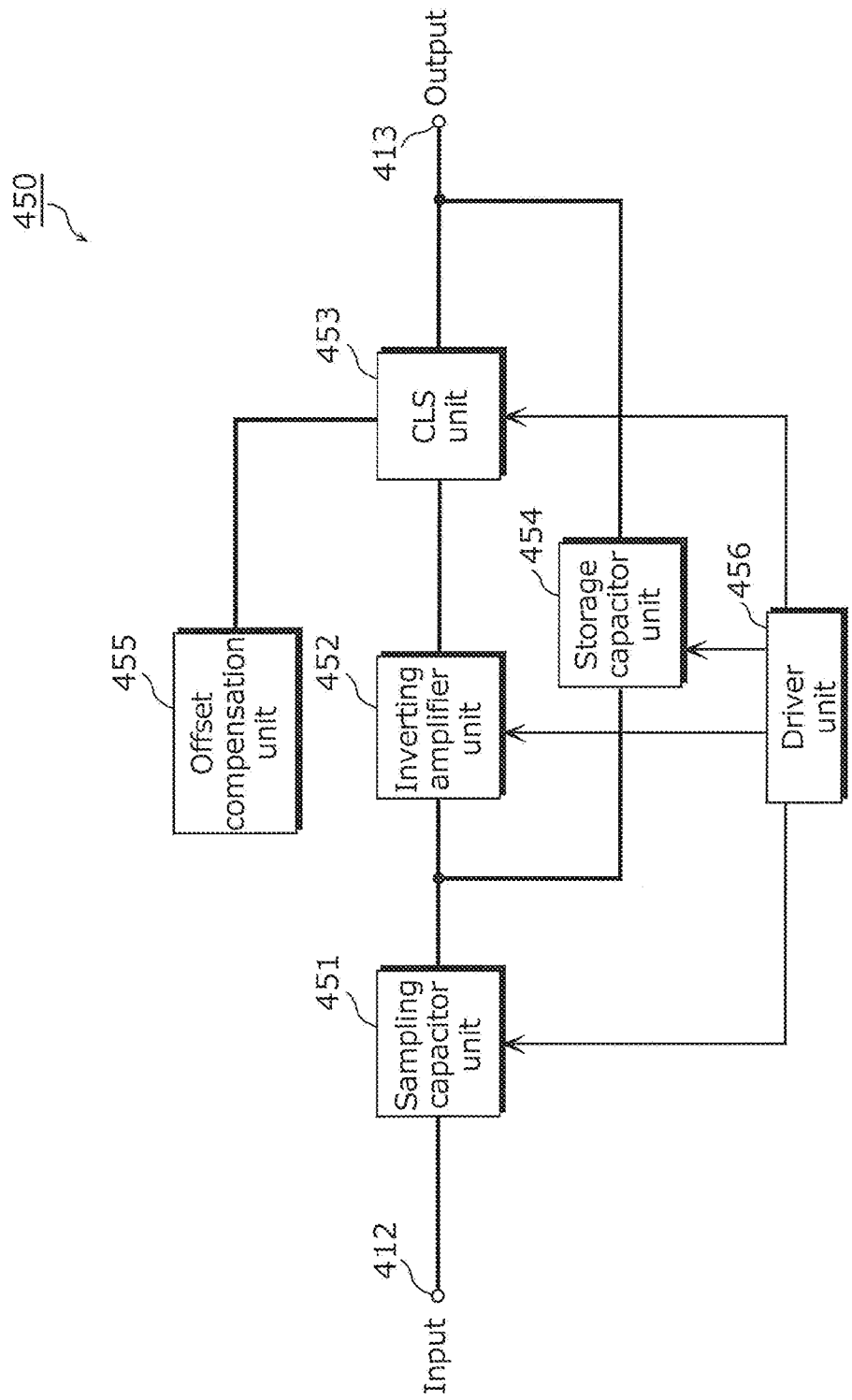
FIG. 8 is a functional block diagram of a switched capacitor circuit according to Embodiment 2.

FIG. 8 is a functional block diagram of a switched capacitor circuit according to Embodiment 2. A switched capacitor circuit 450 illustrated in FIG. 8 includes a sampling capacitor 451, an inverting amplifier unit 452, a CLS unit 453, a storage capacitor 454, an offset compensation unit 455, an input terminal 412, an output terminal 413, and a driver unit 456. The driver unit 455 controls these units so that the switched capacitor circuit 400 in operation transits from a sampling phase to a transfer phase to a CLS phase in this order. These phases of the switched capacitor circuit 450 never overlap each other at any time.

The sampling capacitor unit 451 includes an input port and an output port. In the sampling phase, the input port is connected to the input terminal 412, and the sampling capacitor unit 451 samples a potential difference between a first reference voltage and an input voltage applied to the input terminal 417. In the transfer phase and the CLS phase, the input port of the sampling capacitor 451 is unconnected with the input terminal 412, so that the first reference voltage is applied to the input port.

The inverting amplifier unit 452 includes an input port and an output port. The input port and output port of the inverting amplifier 452 are short-circuited in the sampling phase, and open in the transfer phase and the CLS phase.

The CLS unit 453 includes an input port and an output port. In the sampling phase and the transfer phase, the sampling CLS unit 453 samples a potential difference between a short-circuit voltage of the offset compensation unit 455 and a voltage at the output port of the inverting amplifier unit 452.

The offset compensation unit 455 includes an input port and an output port which are short-circuited. In the sampling phase and the transfer phase, the short-circuit voltage is applied to the input port of the CLS unit 453.

In the sampling phase, a path from the output port of the sampling capacitor 451 to the output terminal 413 via the storage capacitor unit 454 is open. In the transfer phase and the CLS phase, the path is closed.

Figure 9:
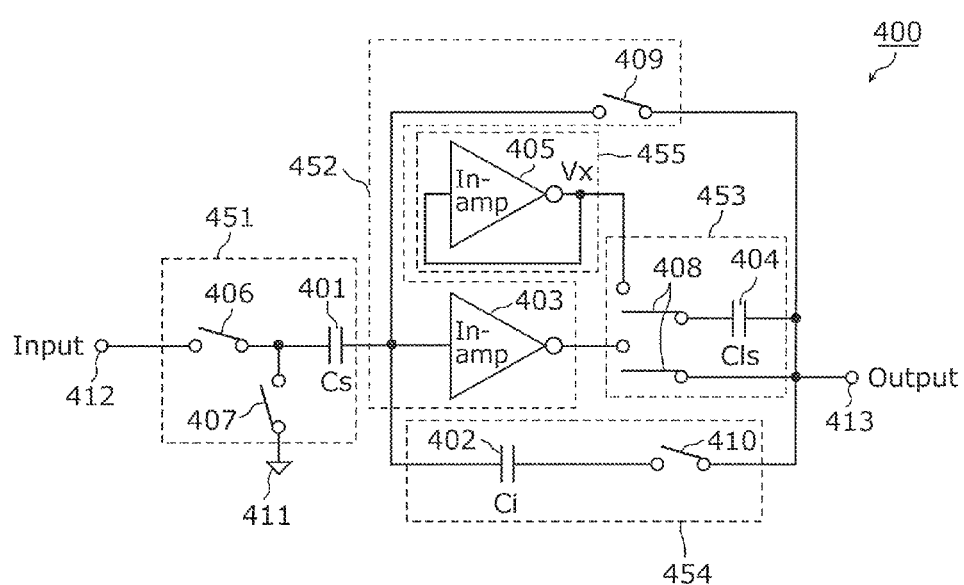
FIG. 9 is a circuit configuration diagram of the switched capacitor circuit according to Embodiment 2.

FIG. 9 is a circuit configuration diagram of the switched capacitor circuit according to Embodiment 2. The circuit configuration of the switched capacitor circuit 400 illustrated in FIG. 9 is an example of the units (except the driver unit 456) of the switched capacitor circuit 450 illustrated in FIG. 8. The switched capacitor circuit 400 includes capacitors 401, 402, and 404, inverting amplifiers 403 and 405, switches 406, 407, 408, 409, and 410, a reference voltage source 411, an input terminal 412, and an output terminal 413.

The driver unit 456 in FIG. 8, not shown in the circuit configuration illustrated in FIG. 9, controls operation of the switches 406, 407, 408, 409, and 410.

The input terminal 412 is a first input terminal, and the output terminal 413 is a first output terminal.

The capacitor 401 is a sampling capacitor including a first terminal and a second terminal, and is connected so that an input voltage is applied to the first terminal.

The inverting amplifier 403 is a first inverting amplifier including a second input terminal and a second output terminal, and the second input terminal is connected to the second terminal.

The inverting amplifier 405 is a second inverting amplifier including a third input terminal and a third output terminal which are short-circuited, and has the same short-circuit voltage as the short-circuit voltage of the inverting amplifier 403.

The capacitor 404 is a level-shifting capacitor including a fifth terminal and a sixth terminal, and is included in the switched capacitor circuit 400 so that the sixth terminal is connected to the first output terminal and the fifth terminal is switchably connected to the third output terminal or the second output terminal. The capacitor 404 samples a potential difference between the short-circuit voltage Vx of the inverting amplifier 405 and the voltage at the second output terminal, and shifts the level of the voltage at the second output terminal when the capacitor 404 is electrically connected in series between the second output terminal and the output terminal 413.

The capacitor 402 is a storage capacitor including a seventh terminal and an eighth terminal and is connected so that the seventh terminal and the eighth terminal are connected to the second terminal and the sixth terminal, respectively.

The switched capacitor circuit 400 in operation transits from a sampling phase to a transfer phase to a CLS phase in this order according to ON-OFF control of the switches. These phases of the switched capacitor circuit never overlap each other at any time. The inverting amplifier 405 itself is identical to the inverting amplifier 403. The third input terminal and the third output terminal are short-circuited and the short-circuit voltage Vx [V] is a bias voltage of the capacitor 404. The short-circuit voltage Vx [V] is also a virtual ground voltage of the inverting amplifier 403, so that the offset of the Vx [V] is added to the voltage at the output terminal 413. The following describes operation of the switched capacitor circuit 400 in each of the phases.

Figure 10A:
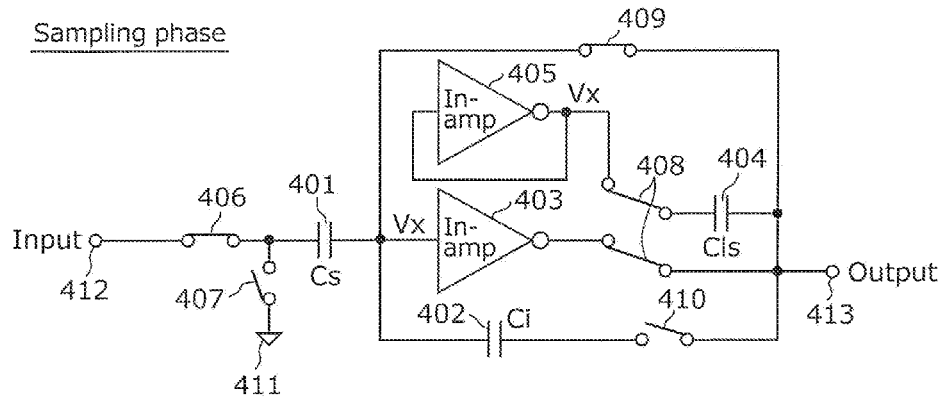
FIG. 10A is a circuit diagram illustrating connection in the switched capacitor according to Embodiment 2 in a sampling phase.
Figure 10B:
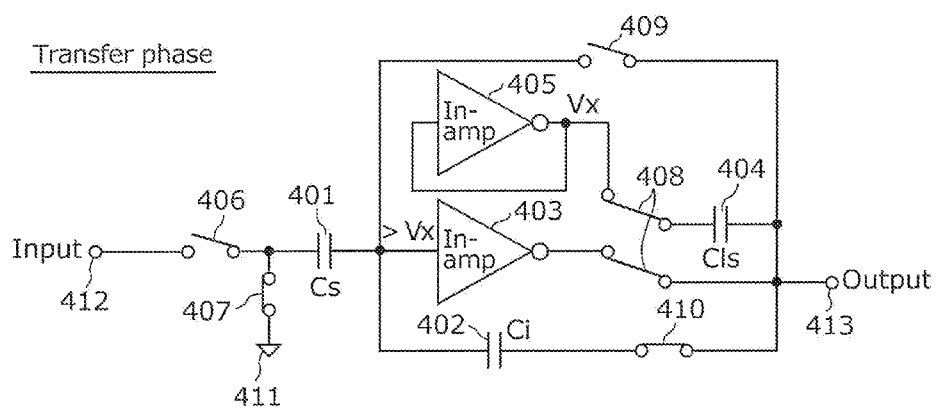
FIG. 10B is a circuit diagram illustrating connection in the switched capacitor according to Embodiment 2 in a transfer phase.
Figure 10C:
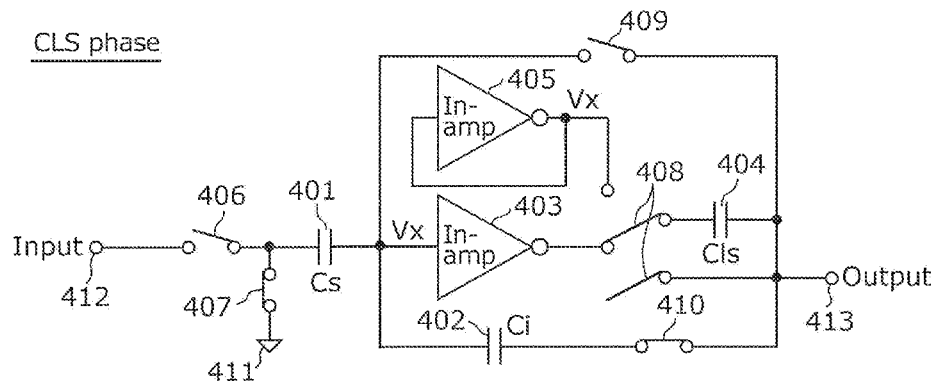
FIG. 10C is a circuit diagram illustrating connection in the switched capacitor according to Embodiment 2 in a CLS phase.

FIG. 10A, FIG. 10B, and FIG. 10C are circuit diagrams illustrating connection in the switched capacitor circuit according to Embodiment 2 in the sampling phase, transfer phase, and CLS phase, respectively.

As illustrated in FIG. 10A, in the sampling phase, the switches 406 and 409 are each short-circuited, the switches 407 and 410 are open, one of the switches 408 connects the output port of the inverting amplifier 405 and the capacitor 404, and the other of the switches 408 connects the second output terminal of the inverting amplifier 403 and the output terminal 413. At this time, the second input terminal and second output terminal of the inverting amplifier 403 are short-circuited, and the short-circuit voltage of the inverting amplifier 403 is equal to Vx [V]. The capacitor 401 stores a charge of Cs·(Vin−Vx) [C] with the first electrode (left side of FIG. 10A) being a positive electrode, where the voltage at the input terminal 412 is Vin [V] and the reference voltage of the reference voltage source 411 is 0 [V]. At the same time, the capacitor 402 remains unchanged. The initial charge of the capacitor 402 is assumed to be 0 [C] for ease of explanation.

In the transfer phase following the sampling phase, the switches 406 and 409 are open, the switches 407 and 410 are each short-circuited, and the connection of the switches 408 is maintained as illustrated in FIG. 10B. With this connection, transfer of the whole charge stored in the capacitor 401, which amount to Cs·Vin [C], to the capacitor 402 proceeds. In other words, the voltage across the capacitor 402 increases toward Cs·Vin/Ci [V]. Furthermore, the inverting amplifier 403 also drives the capacitor 404, so that the voltage across the capacitor 404 also increases toward Cs·Vin/Ci [V].

However, when the gain of the inverting amplifier 403 is insufficient, the voltage at the second input terminal of the inverting amplifier 403 (that is, the virtual ground voltage of the system) floats above Vx [V]. Thus, not the whole charge of the capacitor 404 is transferred to the capacitor 401, and the voltage at the output terminal 413 does not reach Cs·Vin/Ci+Vx [V]. Such insufficient increase of the voltage at the output terminal 413 is caused by a large difference of the voltage at the second output terminal of the inverting amplifier 403 (approximately Cs·Vin/Ci+Vx [V]) from the virtual ground voltage Vx [V].

In the CLS phase following the transfer phase, the connection of the switches 406 and 409 remain open, the switches 407 and 410 each remain short-circuited, and the one of the switches 408 connects the output port of the operational amplifier 403 and the capacitor 404, and the other of the switches 408 is open as illustrated in FIG. 10C. With this connection, the capacitor 404 is connected between the second output terminal of the inverting amplifier 403 and the output terminal 413. The voltage across the capacitor 404 remains approximately at Cs·Vin/Ci [V]. This produces the "level-raising" effect (level-shifting effect) and thereby the voltage at the second output terminal of the inverting amplifier 403 changes from approximately Cs·Vin/Ci+Vx [V] to a level substantially equal to the virtual ground voltage Vx [V]. With this, floating of the voltage at the second input terminal of the inverting amplifier 403 (equal to the virtual ground voltage of the system) is significantly reduced, so that the charge of the capacitor 401 is substantially completely transferred to the capacitor 402. As a result, the voltage across the capacitor 402 becomes substantially equal to Cs·Vin/Ci [V], so that the switched capacitor circuit 400 achieves accurate charge transfer even when the gain of the inverting amplifier included in the switched capacitor circuit 400 is low.

Furthermore, the switched capacitor circuit 400 performs iterations of the operation cycle from the sampling phase through the CLS phase, and thereby performs integration operation accurately despite the low gain of the operational amplifier included in the switched capacitor circuit.

In the above-described configuration, the switched capacitor circuit includes not a differential operational amplifier but instead a single-ended inverting amplifier, so that a switched capacitor circuit which is accurate and capable of faster operation is provided.

The control operation in Embodiment 2 is not limited to the control method using the driver unit 456 which synchronously sends control signals to the other units of the switched capacitor circuit 450 illustrated in FIG. 8 so that the switched capacitor circuit 400 transits from the sampling phase to the transfer phase to the CLS phase. For example, each of the switches included in the units may asynchronously and autonomously switches upon or in conjunction with switching between ON and OFF of the other switches.

Embodiment 3

Figure 11A:
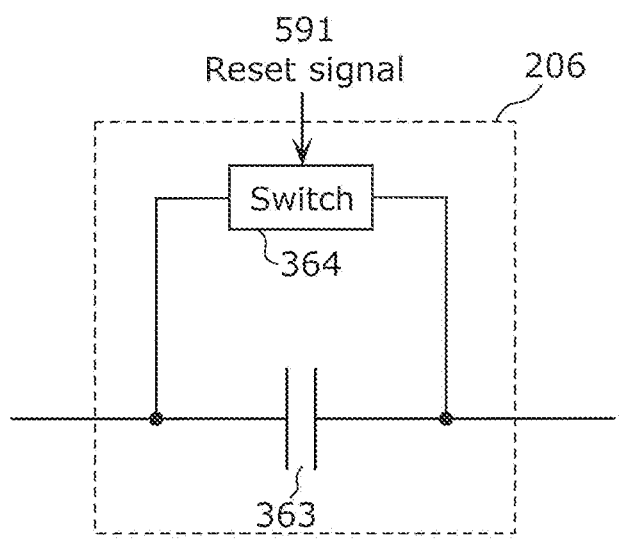
FIG. 11A is a configuration diagram of a storage capacitor unit according to Embodiments 3 and 4.

When the switched capacitor circuit according to Embodiment 1 or 2 is applied to an integrator, the storage capacitor unit 206 may be configured as illustrated in FIG. 11A.

FIG. 11A is a configuration diagram of a storage capacitor unit according to Embodiment 3. The storage capacitor unit 206 illustrated in FIG. 11A includes a capacitor 363 and a switch 364 connected in parallel with the capacitor 363. The switch 364 is short-circuited or open according to a reset signal 591 from the driver unit 209.

FIG. 11A is a timing diagram 501 illustrating timing of activation of the reset signal 591, where the switch 364 is short-circuited while the reset signal 591 is high and the switch 364 is open while the reset signal 591 is low.

Figure 12A:
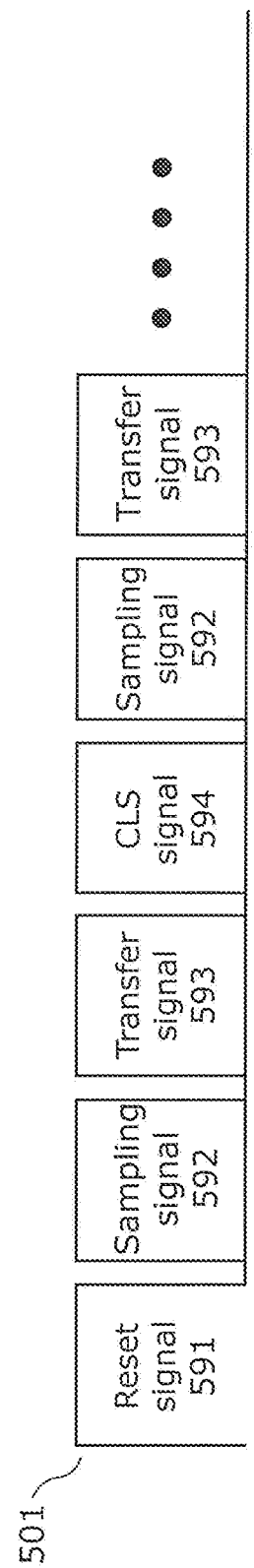
FIG. 12A is a timing diagram of a control signal according to Embodiment 3 and a variation thereof.

FIG. 12A is a timing diagram of a control signal according to Embodiment 3. As illustrated in FIG. 12A, the reset signal 591 is turned high only once before starting integration, and subsequently maintained low. The reset signal 591 at a high level initializes the charge of the capacitor 363 to be 0 [C].

Figure 11B:
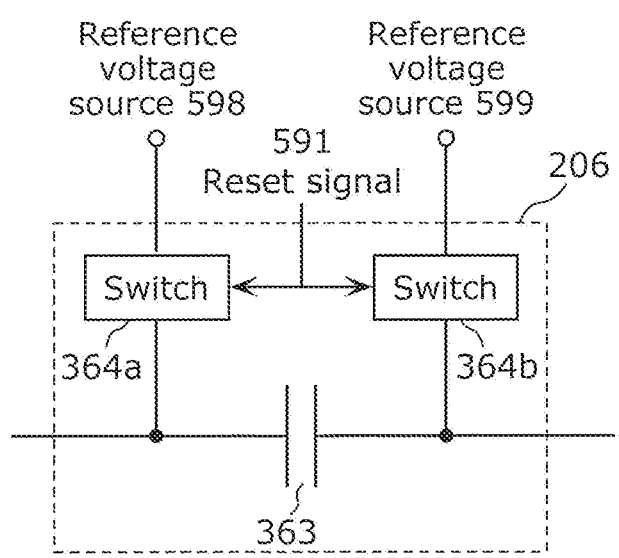
FIG. 11B is a configuration diagram of a storage capacitor unit according to a variation of Embodiment 3 and a variation of Embodiment 4.

When the switched capacitor circuit according to Embodiment 1 or 2 is applied to an integrator, the storage capacitor unit 206 may also be configured as illustrated in FIG. 11B.

FIG. 11B is a configuration diagram of a storage capacitor unit according to a variation of Embodiment 3. The storage capacitor unit 206 illustrated in FIG. 11B includes the capacitor 363, a switch 364a which connects one of the terminal of the capacitor 363 and the reference voltage source 598, a switch 364b which connects the other terminal of the capacitor 363 and a reference voltage source 599. The switches 364a and 364b are short-circuited or open according to the reset signal 591 from the driver unit 209. The reset signal 591 is activated with timing illustrated in the timing diagram 501 in FIG. 12A. The storage capacitor unit 206 has the above-described configuration and the reset signal 591 is activated with the above-described activation timing, so that the voltage of the capacitor is initialized to a certain voltage determined by the reference voltage sources 598 and 599 when the integrator is reset.

Embodiment 4

When the switched capacitor circuit according to Embodiment 1 or 2 is applied to a sample-and-hold circuit, the storage capacitor unit 206 may be configured as illustrated in FIG. 11A. The switch 364 is short-circuited or open according to a reset signal 591 from the driver unit 209.

Figure 12B:
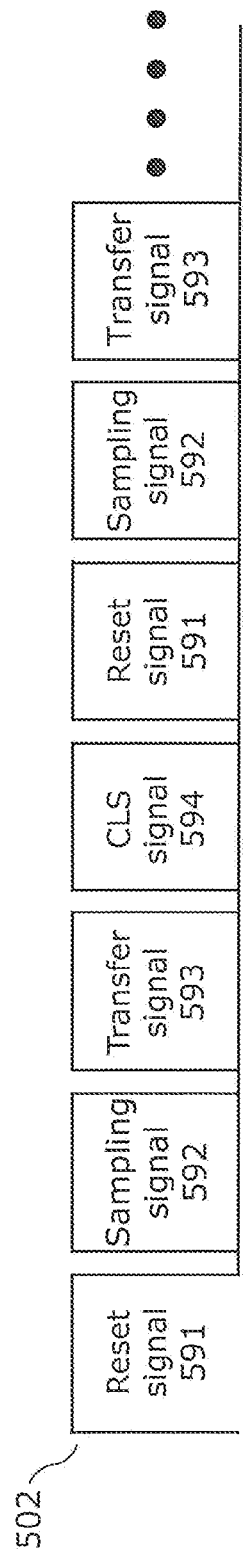
FIG. 12B is a timing diagram of a control signal according to Embodiment 4 and a variation thereof.

FIG. 12B is a timing diagram 502 illustrating timing of activation of the reset signal 591, where the switch 364 is short-circuited while the reset signal 591 is high and the switch 364 is open while the reset signal 591 is low.

FIG. 12B is a timing diagram of a control signal according to Embodiment 4. As illustrated in FIG. 12B, resetting phases are necessary at the initialization and between the CLS phase and the sampling phase.

When the switched capacitor circuit according to Embodiment 1 or 2 is applied to a sample-and-hold circuit, the storage capacitor unit 206 may be configured as illustrated in FIG. 11B. The switches 364a and 364b are short-circuited or open according to the reset signal 591 from the driver unit 209. The reset signal 591 is activated with timing illustrated in the timing diagram 502 in FIG. 12B.

FIG. 12B is a timing diagram of a control signal according to a variation of Embodiment 4. As illustrated in FIG. 12B, resetting phases are necessary at the initialization and between the CLS phase and the sampling phase. In the resetting phases, the voltage of the capacitor 363 is initialized to a certain voltage determined by the reference voltage sources 598 and 599.

Embodiment 5

The following describes a device according to Embodiment 5 which includes any one of the switched capacitor circuit, integrator, and sample-and-hold circuit according to the above-described Embodiments 1 to 4.

Figure 13:
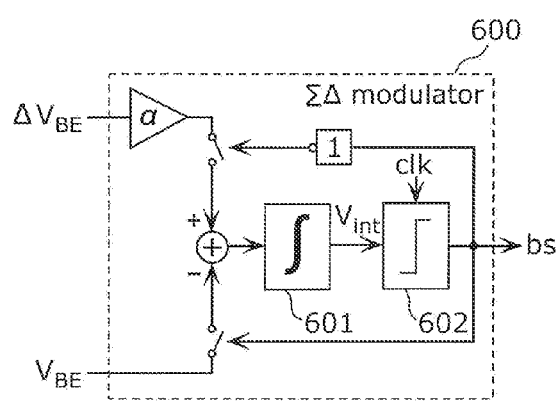
FIG. 13 is a block diagram showing a configuration of a ΔΣ modulator including the integrator in the present disclosure.

FIG. 13 is a block diagram showing a configuration of a ΔΣ modulator including the integrator in the present disclosure. The integrator according to Embodiment 3 or the variation thereof is applicable to a ΔΣ modulator 600 illustrated in FIG.

13. The configuration of the ΔΣ modulator disclosed in FIG. 13 is obtained by, for example, replacing an integrator of a ΔΣ modulator disclosed in NPL 3 (M. A. P. Pertijs, et al., "A CMOS Smart Temperature Sensor With a 3σ Inaccuracy of ±0.1° C. From −55° C. to 125° C.," IEEE Journal of Solid-State Circuits, vol. 40, no. 12, pp. 2805-2815, December 2005) with the integrator according to the present invention. The ΔΣ modulator 600 includes an integrator 601 according to the present invention and a clock synchronous comparator 602. The integrator 601 according to the present invention operates fast and accurately with a current as small as ever, so that the ΔΣ modulator 600 operates accurately as a whole.

Furthermore, a temperature sensor is provided using an analog-digital (AD) converter including the ΔΣ modulator 600 illustrated in FIG. 13.

Figure 14:
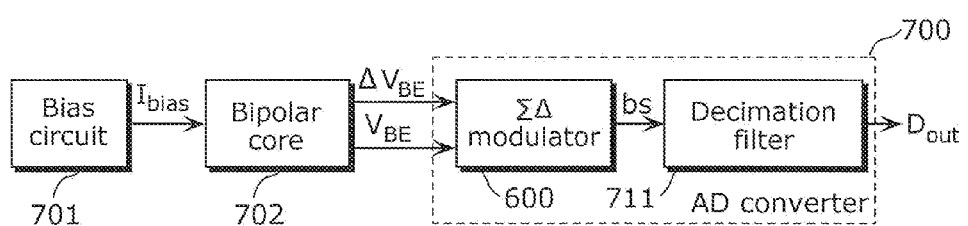
FIG. 14 is a block diagram showing a configuration of a sensor circuit including the ΔΣ modulator in the present disclosure.

FIG. 14 is a block diagram showing a configuration of a sensor circuit including a ΔΣ modulator in the present disclosure. The temperature sensor circuit disclosed in FIG. 14 is obtained by replacing the AD converter of the temperature sensor circuit proposed in NPL 3 with an AD converter 700 in the present disclosure. The temperature sensor circuit in FIG. 14 includes an AD converter 700, a bias circuit 701, and a bipolar core 702. The AD converter 700 includes the ΔΣ modulator 600 in the present disclosure and a decimation filter 711. The accuracy of the whole system of the temperature sensor circuit configured as described above depends on the AD converter 700. The temperature sensor circuit to which the AD converter 700 with the integrator 601 including the switched capacitor circuit in the present disclosure is applied operates fast and accurately with a current as small as ever.

Embodiment 6

The following describes an imaging device and a digital camera according to Embodiment 6 including the AD converter according to Embodiment 5. The AD converter 700 illustrated in FIG. 14 is applicable to an imaging device.

Figure 15:
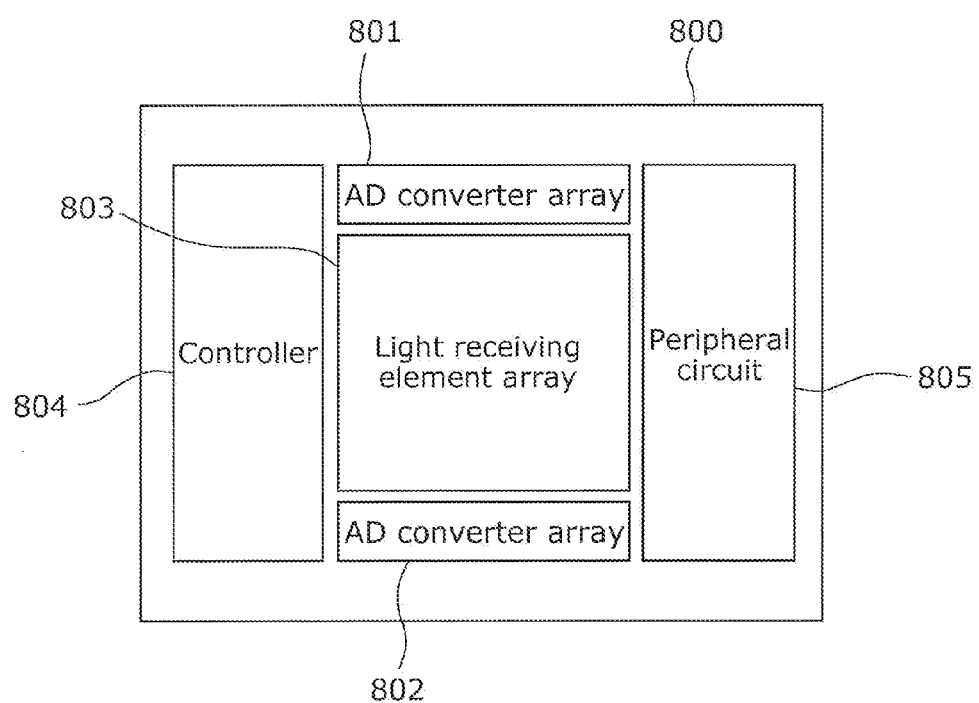
FIG. 15 is a block diagram showing a configuration of an imaging device including the AD converter in the present disclosure.

FIG. 15 is a block diagram illustrating a configuration of an imaging device including the AD converter in the present disclosure. FIG. 15 shows an imaging device 800 including AD converter arrays 801 and 802, a light receiving element array 803 in which light-receiving elements are arranged in rows and columns, a controller 804, and a peripheral circuit 805.

Generally, the number of pixels of an imaging device included in a CMOS image sensor depends on sensitivity of light-receiving elements. However, power consumption of the AD converter is also an important factor determining the number of the pixels. A general column-parallel AD converter includes the AD converters arrays 801 and 802 at the top and the bottom of the light receiving element array 803, respectively. Each of the AD converter arrays 801 and 802 includes AD converters on the order of several thousand units. Thus, the AD converters consume a large amount of power, and heat and battery life are difficulty in increasing of the pixel count.

However, the above-described AD converter 700 minimizes consumption current to a level as small as possible. The AD converter 700 thus allows for increase in pixel count, decrease of heat generation, and extension of battery life. The AD converter 700 also contributes to reduction of area. The imaging device to which the AD converter 700 with the integrator including the switched capacitor circuit in the present disclosure is applied operates fast and accurately with a small current as ever.

Figure 16A:
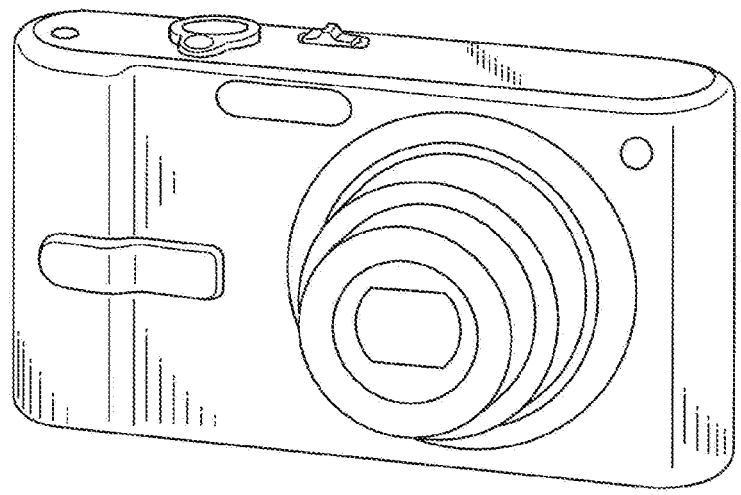
FIG. 16A illustrates an external view of an example of a digital still camera.

Furthermore, the present invention may be also implemented as a mobile phone or a digital camera, such as a digital still camera or a digital camcorder, including the imaging device 800. The imaging device 800 is preferably usable as an imaging device of a digital still camera illustrated in FIG. 16A and an imaging device of a camera module for mobile devices such as mobile phones.

Figure 16B:
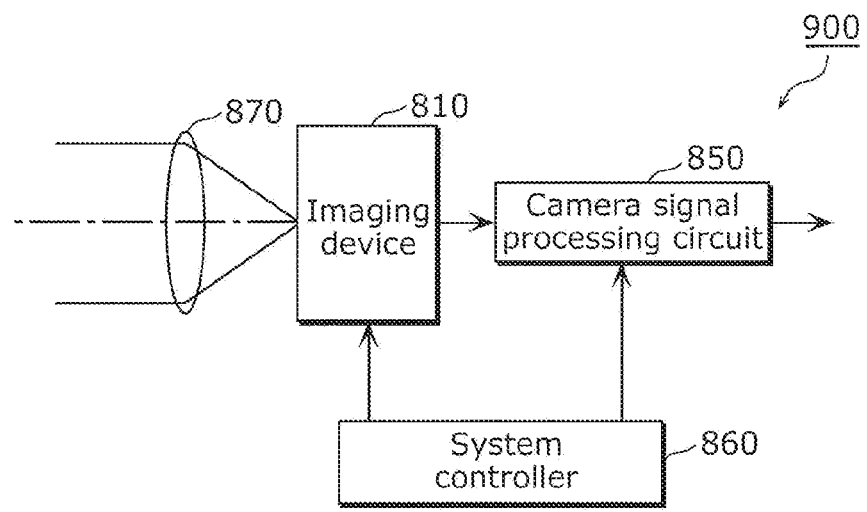
FIG. 16B is a block diagram showing a configuration of a digital camera including the imaging device in the present disclosure.
Figure 17:
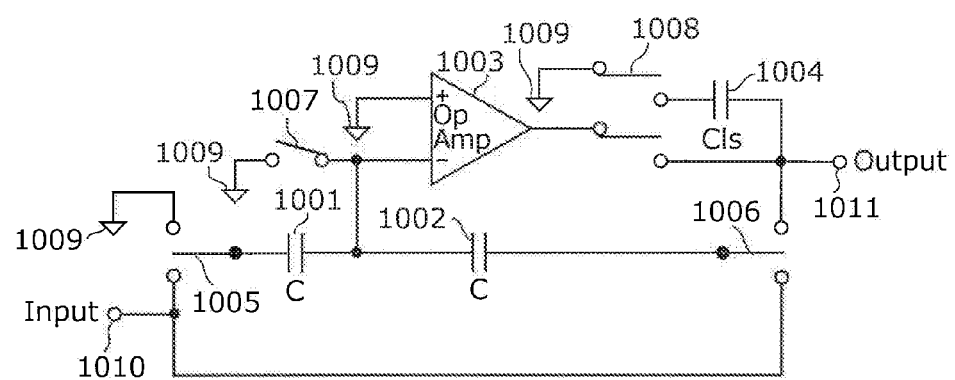
FIG. 17 illustrates a configuration of a conventional switched capacitor circuit disclosed in NPL 2.
Figure 18A:
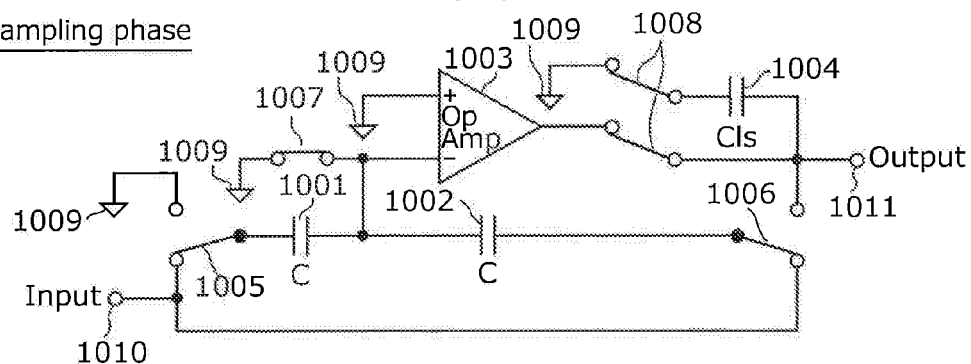
FIG. 18A illustrates connection in the conventional switched capacitor circuit disclosed in NPL 2 in a sampling phase.
Figure 18B:
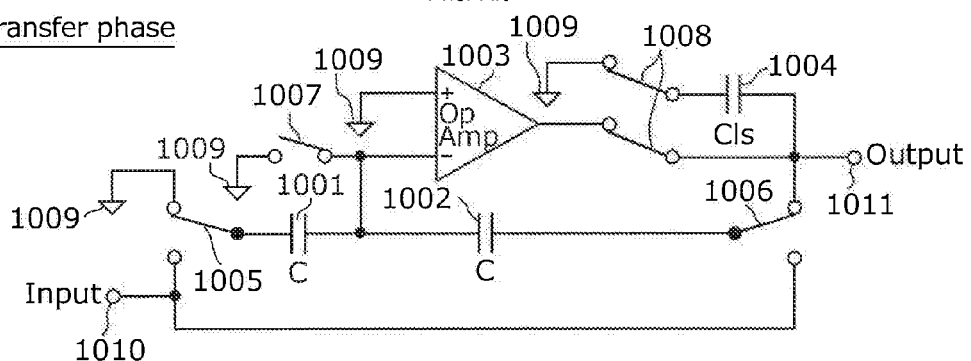
FIG. 18B illustrates connection in the conventional switched capacitor circuit disclosed in NPL 2 in a transfer phase.
Figure 18C:
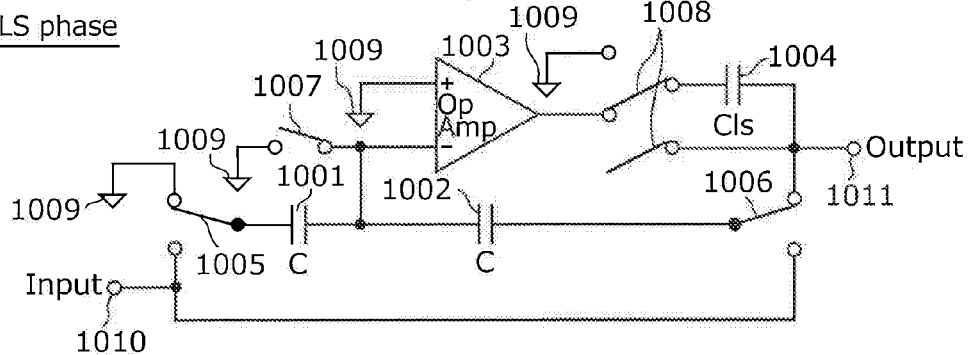
FIG. 18C illustrates connection in the conventional switched capacitor circuit disclosed in NPL 2 in a CLS phase.

FIG. 16B is a block diagram showing a configuration of a digital camera including the imaging device in the present disclosure. FIG. 16B illustrates a digital camera 900 according to Embodiment 6 including an optical system with a lens 870, an imaging device 810, a camera signal processing circuit 850, and a system controller 860. The lens 870 forms an image on the imaging area of the imaging device 810 from image light from a subject. The imaging device 810 outputs an image signal obtained by converting light image formed on the imaging area by the lens 870 into electric signals on a per-pixel basis. The imaging device 800 according to Embodiment 6 is used as the imaging device 810.

The camera signal processing circuit 850 performs a variety of processing on the image signals output from the imaging device 810. The system controller 860 controls the imaging device 810 and the camera signal processing circuit 850.

The digital camera 900 in this configuration operates for a longer time with a battery owing to the small consumption current, and operates accurately.

The switched capacitor circuit and the method of driving the switched capacitor circuit, and devices including the switched capacitor circuits have been described according to Embodiments 1 to 6. The present invention is not limited to these embodiments.

The AD converter and each processing units included in the imaging device according to the above-described embodiments are typically implemented as one or more system LSIs, which are integrated circuits. These integrated circuits may be separate chips, and optionally some or all of the integrated circuits may be integrated into a single chip.

The method of forming integrated circuits is not limited to use of such LSIs. A dedicated circuit or a general-purpose processor may be used instead. Also applicable is a field programmable gate array (FPGA), which allows post-manufacture programming, or a reconfigurable processor LSI, which allows post-manufacture reconfiguration of connection and setting of circuit cells therein.

All or part of the configuration or function of the switched capacitor circuits, AD converters, and variations thereof according to the above-described embodiments may be used in combination.

The numbers used in the above-described embodiments are all used merely for describing the present invention in concrete terms and not limiting to the present invention. The switching states described using high and low are used merely for describing the present invention in concrete terms. A similar result may be obtained by using the switching states in different combinations. The types (such as n-type and p-type) of transistors and others are used merely for describing the present invention in concrete terms. A result equivalent to the above-described ones may be obtained by using transistors and others of the other type. The above-described connection between the constituent elements are used merely for describing the present invention in concrete terms, and connection to achieves the functions according to the present invention is not limited to the above-described connection.

The functional blocks in the block diagrams illustrate a mere exemplary division of functions. Two or more of the functional blocks may be implements as a single functional block, and a single functional block may be divided into two or more functional blocks. Part of a function depicted as a single block may be incorporated into another functional block. Optionally, similar functions depicted as plural functional blocks may be performed by a single piece of hardware or software in parallel or by time-sharing.

The MOS transistor used in the above-description as an example may be replaced with a transistor of a different type.

The circuit configurations illustrated in the circuit diagrams are mere examples, and the present invention is not limited to the circuit configurations. Thus, not only the above-described circuit configurations but also any circuit capable of providing the functions characteristic to the present invention is also within the scope of the present invention. For example, a circuit in a configuration where elements such as a switching element (transistor), a resistor, and capacitors connected in parallel or series with an element is also within the scope of the present invention to the extent that the circuit provides the functions analogous to the functions of the circuit in the above-described configuration. Specifically, the "connection" in the above-described embodiments refers to not only direct connection of two terminals (nodes) but also connection of the two terminals (nodes) via another element to the extent that the connection allows a circuit to provide functions analogous to the functions of the circuit in the above-described configuration.

The present invention also includes variations of any of the present embodiments conceived by those skilled in the art unless the variations depart from the spirit and scope of the present invention.

INDUSTRIAL APPLICABILITY

The present invention is applicable to AD converters, temperature sensors, imaging devices, digital cameras, and the like which are required to operate accurately with a small power.

REFERENCE SIGNS LIST

100 integrator
101, 102, 104, 311, 321, 341, 351, 361, 363, 401, 402, 404, 1001, 1002, 1004 capacitor
103, 1003 operational amplifier
105, 106, 107, 108, 109, 312, 313, 322, 331, 342, 343, 344, 352, 353, 362, 364, 364a, 364b, 406, 407, 408, 409, 410, 1005, 1006, 1007, 1008 switch
110, 314, 411, 598, 599, 1009 reference voltage source
111, 207, 412, 1010 input terminal
112, 208, 413, 1011 output terminal
200, 300, 400, 450 switched capacitor circuit
201, 451 sampling capacitor unit
202 first clamping capacitor unit
203, 452 inverting amplifier unit
204 second clamping capacitor unit
205, 453 CLS unit
206, 454 capacitor unit
209, 456 driver unit
251, 253 p-type transistor
252 n-type transistor
332, 403, 405 inverting amplifier
455 offset compensation unit
591 reset signal
592 sampling signal
593 transfer signal
594 CLS signal
600 ΔΣ modulator
601 integrator
602 clock-synchronous comparator
700 AD converter
701 bias circuit
702 bipolar core
711 decimation filter
800 imaging device
801, 802 AD converter array
803 light receiving element array
804 controller
805 peripheral circuit
810 imaging device
850 camera signal processing circuit
860 system controller
870 lens
900 digital camera

The invention claimed is:

1. A switched capacitor circuit comprising:
a first input terminal to which an input voltage is input;
a first output terminal from which an output voltage is output;
a sampling capacitor including a first terminal to which the input voltage is applied and a second terminal;
a first clamping capacitor including a third terminal and a fourth terminal, the third terminal being connected to the second terminal;
a first inverting amplifier including a second input terminal and a second output terminal, the second input terminal being connected to the fourth terminal;
a level-shifting capacitor including a fifth terminal and a sixth terminal and electrically connected in series between the fourth terminal and the first output terminal, the sixth terminal being connected to the first output terminal;
a second clamping capacitor including a seventh terminal and an eighth terminal, the seventh terminal being connected to the second output terminal, the eighth terminal being connected to the fifth terminal; and
a storage capacitor including a ninth terminal and a tenth terminal, the ninth terminal being connected to the second terminal, the tenth terminal being connected to the sixth terminal.

2. The switched capacitor circuit according to claim 1,
wherein the second clamping capacitor samples a potential difference between a short-circuit voltage of the first inverting amplifier and a reference voltage while the first inverting amplifier is short-circuited with the second input terminal and the second output terminal connected, and
the level-shifting capacitor shifts a voltage level of the second output terminal when the level-shifting capacitor is electrically connected in series between the eighth terminal of the second clamping capacitor and the first output terminal.

3. The switched capacitor circuit according to claim 1,
wherein in a sampling phase:
the sampling capacitor samples a potential difference between the input voltage input to the first terminal and a reference voltage;
the first clamping capacitor and the second clamping capacitor each sample a potential difference between the reference voltage and a short-circuit voltage of the first inverting amplifier which is short-circuited with the second input terminal and the second output terminal connected; and
the fifth terminal and the sixth terminal are short-circuited, and
a path from the second terminal to the first output terminal via the storage capacitor is open.

4. The switched capacitor circuit according to claim 3,
wherein in a transfer phase in which voltage sampled in the sampling phase is transferred and in a level-shifting phase in which the voltage transferred causes shifting of a voltage level of the second output terminal:
the first terminal of the sampling capacitor is at the reference voltage; and
the first clamping capacitor is electrically connected in series between the second terminal and the first input terminal while holding the potential difference sampled in the sampling phase,
in the transfer phase:
the level-shifting capacitor holds the potential difference between the reference voltage and the voltage at the second output terminal, and
in the level-shifting phase,
the level-shifting capacitor is electrically connected in series between the eighth terminal and the first output terminal while holding the potential difference held in the transfer phase.

5. The switched capacitor circuit according to claim 1, further comprising a driver unit configured to:
in a sampling phase, connect the first terminal and the first input terminal,
short-circuit the second input terminal and the second output terminal,
connect the sixth terminal and the eighth terminal,
set the fifth terminal and the sixth terminal at a reference voltage, and
open a path from the second terminal to the first output terminal via the storage capacitor;
in a transfer phase in which voltage sampled in the sampling phase is transferred and in a level-shifting phase in which the voltage transferred causes shifting of a voltage level of the second output terminal,
set the first terminal at the reference voltage, and
electrically connect the first clamping capacitor in series between the second terminal and the first input terminal;
in the transfer phase,
connect the second output terminal and the sixth terminal, and
connect a path from the second terminal to the first output terminal via the storage capacitor; and
in the level-shifting phase,
electrically connect the second clamping capacitor in series between the second output terminal and the fifth terminal, and
electrically connect the level-shifting capacitor in series between the eighth terminal and the first output terminal.

6. The switched capacitor circuit according to claim 1, wherein the first inverting amplifier includes an inverter circuit.

7. The switched capacitor circuit according to claim 6, wherein the inverter circuit includes a switched-current bias circuit.

8. An integrator comprising:
the switched capacitor circuit according to claim 1; and
an initialization mechanism which causes a charge stored in the storage capacitor to be released,
wherein iterations of an operation cycle from a sampling phase to a transfer phase to a level-shifting phase are performed, the transfer phase being a phase in which voltage sampled in the sampling phase is transferred, the level-shifting phase being a phase in which the voltage transferred causes shifting of a voltage level of the second output terminal, and
the initialization mechanism operates only before an initial one of the iterations is started.

9. A sensor circuit comprising
the integrator according to claim 8.

10. An analog-digital converter comprising
the integrator according to claim 8.

11. A system LSI comprising
the analog-digital converter according to claim 10.

12. An imaging device comprising
the analog-digital converter according to claim 10.

13. A digital camera comprising
the imaging device according to claim 12.

14. A sample-and-hold circuit comprising:
the switched capacitor circuit according to claim 1,
an initialization mechanism which causes a charge stored in the storage capacitor to be released,
wherein iterations of an operation cycle from a sampling phase to a transfer phase to a level-shifting phase are performed, the transfer phase being a phase in which voltage sampled in the sampling phase is transferred, the level-shifting phase being a phase in which the voltage transferred causes shifting of a voltage level of the second output terminal, and
the initialization mechanism operates between the iterations.

15. A sensor circuit comprising
the sample-and-hold circuit according to claim 14.

16. An analog-digital converter comprising
the sample-and-hold circuit according to claim 14.

17. A system LSI comprising
the analog-digital converter according to claim 16.

18. An imaging device comprising
the analog-digital converter according to claim 16.

19. A digital camera comprising
the imaging device according to claim 18.

20. A switched capacitor circuit comprising:
a first input terminal to which an input voltage is input;
a first output terminal from which an output voltage is output;
a sampling capacitor including a first terminal to which the input voltage is applied and a second terminal;
a first inverting amplifier including a second input terminal and a second output terminal, the second input terminal being connected to the second terminal;
a second inverting amplifier including a third input terminal and a third output terminal which are short-circuited, the second inverting amplifier having a short-circuit voltage equal to a short-circuit voltage of the first inverting amplifier;
a level-shifting capacitor including a fifth terminal and a sixth terminal, the sixth terminal being connected to the first output terminal, and the fifth terminal switchably connected to the third output terminal or the second output terminal; and
a storage capacitor including a seventh terminal and an eighth terminal, the seventh terminal being connected to the second terminal, and the eighth terminal being connected to the sixth terminal.

21. The switched capacitor circuit according to claim 20,
wherein the level-shifting capacitor samples a potential difference between a short-circuit voltage of the second inverting amplifier and a voltage at the second output terminal, and when the level-shifting capacitor is electrically connected in series between the second output terminal and the first output terminal, shifts a voltage level of the second output terminal.

22. The switched capacitor circuit according to claim 20, wherein the first inverting amplifier includes an inverter circuit.

23. The switched capacitor circuit according to claim 22, wherein the inverter circuit includes a switched-current bias circuit.

24. An integrator comprising:
the switched capacitor circuit according to claim 20; and
an initialization mechanism which causes a charge stored in the storage capacitor to be released,
wherein iterations of an operation cycle from a sampling phase to a transfer phase to a level-shifting phase are performed, the transfer phase being a phase in which voltage sampled in the sampling phase is transferred, the level-shifting phase being a phase in which the voltage transferred causes shifting of a voltage level of the second output terminal, and
the initialization mechanism operates only before an initial one of the iterations is started.

25. A sensor circuit comprising
the integrator according to claim 24.

26. An analog-digital converter comprising
the integrator according to claim 24.

27. A system LSI comprising
the analog-digital converter according to claim 26.

28. An imaging device comprising
the analog-digital converter according to claim 26.

29. A digital camera comprising
the imaging device according to claim 28.

30. A sample-and-hold circuit comprising:
the switched capacitor circuit according to claim 20,
an initialization mechanism which causes a charge stored in the storage capacitor to be released,
wherein iterations of an operation cycle from a sampling phase to a transfer phase to a level-shifting phase are performed, the transfer phase being a phase in which voltage sampled in the sampling phase is transferred, the level-shifting phase being a phase in which the voltage transferred causes shifting of a voltage level of the second output terminal, and
the initialization mechanism operates between the iterations.

31. A sensor circuit comprising
the sample-and-hold circuit according to claim 30.

32. An analog-digital converter comprising
the sample-and-hold circuit according to claim 30.

33. A system LSI comprising
the analog-digital converter according to claim 32.

34. An imaging device comprising
the analog-digital converter according to claim 32.

35. A digital camera comprising
the imaging device according to claim 34.

36. A method of driving a switched capacitor circuit which converts a voltage level of an input voltage input through an input voltage terminal and outputs a voltage obtained by the converting of the voltage level through an output voltage terminal, the method comprising:
when terminals of a level-shifting capacitor connected to the output voltage terminal are short-circuited and an electrical path between a sampling capacitor and the output voltage terminal via a storage capacitor is open in the switched capacitor circuit, sampling a potential difference between the input voltage and a reference voltage using the sampling capacitor to which the input voltage is applicable, sampling, using a first clamping capacitor, a potential difference between the reference voltage and a short-circuit voltage of an inverting amplifier with an input terminal and an output terminal short-circuited, and sampling, using a second clamping capacitor, the potential difference between the reference voltage and the short-circuit voltage of the inverting amplifier with the input terminal and the output terminal short-circuited, the level-shifting capacitor being for shifting a voltage level of the output terminal of the inverting amplifier;
subsequently, setting one of terminals of the sampling capacitor at the reference voltage, electrically connecting the first clamping capacitor in series between the input terminal of the inverting amplifier and an other of the terminals of the sampling capacitor, transferring a charge from the sampling capacitor to the storage capacitor by closing the electrical path, and holding a potential difference between the reference voltage and a voltage at the output terminal of the inverting amplifier in the level-shifting capacitor, the one of the terminals of the sampling capacitor being a terminal to which the input voltage is applicable; and
subsequently, connecting one of terminals of the second clamping capacitor to the output terminal of the inverting amplifier, connecting one of terminals of the level-shifting capacitor to an other of the terminals of the second clamping capacitor, and connecting an other of the terminals of the level-shifting capacitor to the output voltage terminal.

37. A method of driving an integrator, the method comprising the method of driving a switched capacitor circuit according to claim 36,
wherein iterations of the method according to claim 36 are performed, and
the method of driving an integrator further comprises causing a charge stored in the storage capacitor to be released only before an initial one of the iterations.

38. A method of driving a sample-and-hold circuit, the method comprising the method of driving a switched capacitor circuit according to claim 36,
wherein iterations of the method according to claim 36 are performed, and
the method of driving a sample-and-hold circuit further comprises causing a charge stored in the storage capacitor to be released only between the iterations.

* * * * *